United States Patent
Venugopal et al.

(10) Patent No.: US 10,529,641 B2
(45) Date of Patent: Jan. 7, 2020

(54) INTEGRATED CIRCUIT NANOPARTICLE THERMAL ROUTING STRUCTURE OVER INTERCONNECT REGION

(71) Applicant: Texas Instruments Incorporated, Dallas, TX (US)

(72) Inventors: Archana Venugopal, Dallas, TX (US); Benjamin Stassen Cook, Rockwall, TX (US); Luigi Colombo, Dallas, TX (US); Robert Reid Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/361,390

(22) Filed: Nov. 26, 2016

(65) Prior Publication Data

US 2018/0151463 A1    May 31, 2018

(51) Int. Cl.
*H01L 23/367* (2006.01)
*H01L 21/768* (2006.01)
(Continued)

(52) U.S. Cl.
CPC ...... *H01L 23/367* (2013.01); *H01L 21/76879* (2013.01); *H01L 23/3677* (2013.01);
(Continued)

(58) Field of Classification Search
CPC .............. H01L 23/367; H01L 23/3733; H01L 23/5226; H01L 21/76879
See application file for complete search history.

(56) References Cited

U.S. PATENT DOCUMENTS

| 5,224,030 A | 6/1993 | Banks et al. |
| 5,481,136 A | 1/1996 | Kohmoto et al. |

(Continued)

FOREIGN PATENT DOCUMENTS

| CN | 105419345 | 3/1916 |
| CN | 105419345 | 3/2016 |

(Continued)

OTHER PUBLICATIONS

Awano et al., Carbon Nanotubes for VLSI: Interconnect and Transistor Applications'—2010, Proceedings of the IEEE, vol. 98, No. 12, pp. 2015-2031.

(Continued)

*Primary Examiner* — Syed I Gheyas
(74) *Attorney, Agent, or Firm* — Michael A. Davis, Jr.; Charles A. Brill; Frank D. Cimino

(57) ABSTRACT

An integrated circuit has a thermal routing structure above a top interconnect level. The top interconnect level includes interconnects connected to lower interconnect levels, and does not include bond pads, probe pads, input/output pads, or a redistribution layer to bump bond pads. The thermal routing structure extends over a portion, but not all, of a plane of the integrated circuit containing the top interconnect level. The thermal routing structure includes a layer of nanoparticles in which adjacent nanoparticles are attached to each other. The layer of nanoparticles is free of an organic binder material. The thermal routing structure has a thermal conductivity higher than the metal in the top interconnect level. The layer of nanoparticles is formed by an additive process.

16 Claims, 17 Drawing Sheets

US 10,529,641 B2

Page 2

(51) Int. Cl.
*H01L 23/373* (2006.01)
*H01L 23/522* (2006.01)

(52) U.S. Cl.
CPC ........ *H01L 23/373* (2013.01); *H01L 23/3733* (2013.01); *H01L 23/3736* (2013.01); *H01L 23/5226* (2013.01); *H01L 2224/48463* (2013.01)

(56) References Cited

U.S. PATENT DOCUMENTS

| | | | |
|---|---|---|---|
| 5,683,939 | A | 11/1997 | Schrantz et al. |
| 6,046,503 | A | 4/2000 | Weigand et al. |
| 6,100,199 | A | 8/2000 | Joshi et al. |
| 6,242,807 | B1 | 6/2001 | Kazami |
| 6,265,771 | B1 | 7/2001 | Ference et al. |
| 6,288,426 | B1 | 9/2001 | Gauthier, Jr. et al. |
| 6,646,340 | B2 | 11/2003 | Deeter et al. |
| 6,771,502 | B2 | 8/2004 | Getz, Jr. et al. |
| 6,773,952 | B2 | 8/2004 | Armbrust et al. |
| 6,800,886 | B2 | 10/2004 | Awano |
| 7,071,603 | B2 | 7/2006 | Ha et al. |
| 7,161,239 | B2 | 1/2007 | Zhao et al. |
| 7,189,778 | B2 | 3/2007 | Tobita |
| 7,260,939 | B2 | 8/2007 | Weaver, Jr. |
| 7,264,869 | B2 | 9/2007 | Tobita |
| 7,286,359 | B2 | 10/2007 | Khbeis et al. |
| 7,312,531 | B2 | 12/2007 | Chang et al. |
| 7,345,364 | B2 | 3/2008 | Kerr et al. |
| 7,473,633 | B2 * | 1/2009 | Furukawa ............... B82Y 10/00 257/E21.171 |
| 7,560,310 | B2 | 7/2009 | Hsu |
| 7,572,680 | B2 | 8/2009 | Hess et al. |
| 7,582,962 | B1 | 9/2009 | Pavio |
| 7,586,191 | B2 | 9/2009 | Hall et al. |
| 7,633,152 | B2 * | 12/2009 | Lee ....................... H01L 23/367 257/706 |
| 7,642,641 | B2 | 1/2010 | Mahler et al. |
| 7,763,973 | B1 * | 7/2010 | Bratkovski ........... H01L 23/473 257/685 |
| 7,768,121 | B2 | 8/2010 | Colgan et al. |
| 7,772,692 | B2 | 8/2010 | Takamatsu et al. |
| 7,825,498 | B2 | 11/2010 | Haga et al. |
| 7,859,087 | B2 | 12/2010 | Murata et al. |
| 7,989,349 | B2 | 8/2011 | Sandhu et al. |
| 8,022,532 | B2 | 9/2011 | Kasuya et al. |
| 8,106,497 | B2 | 1/2012 | Brunnbauer |
| 8,130,500 | B2 | 3/2012 | Oda |
| 8,134,231 | B2 | 3/2012 | Sano et al. |
| 8,148,820 | B2 | 4/2012 | Sato |
| 8,248,803 | B2 | 8/2012 | Lin et al. |
| 8,277,613 | B2 | 10/2012 | Smith |
| 8,410,474 | B2 | 4/2013 | Okai et al. |
| 8,440,999 | B2 | 5/2013 | Dimitrakopoulos et al. |
| 8,462,511 | B2 | 6/2013 | Lee |
| 8,466,054 | B2 | 6/2013 | Stuber et al. |
| 8,470,701 | B2 | 6/2013 | Rogers et al. |
| 8,486,824 | B2 | 7/2013 | Tee et al. |
| 8,524,539 | B2 | 9/2013 | Lee et al. |
| 8,535,758 | B2 | 9/2013 | Bulovic |
| 8,552,554 | B2 | 10/2013 | Tain et al. |
| 8,558,372 | B2 | 10/2013 | Negoro |
| 8,587,064 | B2 | 11/2013 | Warabino |
| 8,637,388 | B2 | 1/2014 | Abou-khalil et al. |
| 8,664,759 | B2 | 3/2014 | Ryan |
| 8,836,110 | B2 | 9/2014 | Chopin et al. |
| 8,865,577 | B2 | 10/2014 | Wei |
| 8,866,276 | B2 | 10/2014 | Su et al. |
| 8,866,294 | B2 | 10/2014 | Pagaila et al. |
| 8,901,613 | B2 | 12/2014 | Sekar |
| 8,937,376 | B2 | 1/2015 | Tsai |
| 8,940,628 | B2 | 1/2015 | Yamazaki et al. |
| 9,013,035 | B2 | 4/2015 | Zhao et al. |
| 9,093,428 | B2 | 7/2015 | Liang |
| 9,099,375 | B2 | 8/2015 | Kub et al. |
| 9,165,721 | B2 | 10/2015 | Lee et al. |
| 9,171,779 | B2 | 10/2015 | Lin et al. |
| 9,245,813 | B2 | 1/2016 | Bartley et al. |
| 9,308,731 | B2 | 4/2016 | Williams |
| 9,331,283 | B2 | 5/2016 | Lim et al. |
| 9,349,838 | B2 | 5/2016 | Cheng et al. |
| 9,349,975 | B2 | 5/2016 | Coe-sullivan et al. |
| 9,362,198 | B2 | 6/2016 | Viswanathan |
| 9,397,023 | B2 | 7/2016 | Venugopal et al. |
| 9,401,315 | B1 | 7/2016 | Bodenweber |
| 2001/0035578 | A1 | 11/2001 | Liang et al. |
| 2003/0064017 | A1 | 4/2003 | Tobita et al. |
| 2003/0122215 | A1 | 7/2003 | Wilson |
| 2004/0102597 | A1 | 5/2004 | Tobita et al. |
| 2005/0079120 | A1 | 4/2005 | Fujita et al. |
| 2005/0133863 | A1 | 6/2005 | Werner et al. |
| 2006/0121710 | A1 | 6/2006 | Liang et al. |
| 2006/0289988 | A1 * | 12/2006 | Ryan ..................... H01L 23/367 257/720 |
| 2007/0001292 | A1 | 1/2007 | Ohta et al. |
| 2007/0126116 | A1 | 6/2007 | Dangelo et al. |
| 2008/0047484 | A1 | 2/2008 | Sung |
| 2008/0266787 | A1 | 10/2008 | Gosset et al. |
| 2009/0162954 | A1 | 6/2009 | Griffin et al. |
| 2009/0218682 | A1 | 9/2009 | Lundberg |
| 2009/0273068 | A1 | 11/2009 | Kaskoun et al. |
| 2010/0140790 | A1 | 6/2010 | Setiadi et al. |
| 2010/0148357 | A1 | 6/2010 | Yang et al. |
| 2010/0207277 | A1 | 8/2010 | Bauer et al. |
| 2011/0039357 | A1 | 2/2011 | Lin et al. |
| 2011/0140232 | A1 | 6/2011 | Gaul et al. |
| 2011/0260303 | A1 | 10/2011 | Pagaila et al. |
| 2011/0272824 | A1 | 11/2011 | Pagaila |
| 2012/0025269 | A1 | 2/2012 | Parkhurst et al. |
| 2012/0042922 | A1 | 2/2012 | Kondo et al. |
| 2012/0086132 | A1 | 4/2012 | Kim et al. |
| 2012/0141678 | A1 | 6/2012 | Sumerel |
| 2013/0127037 | A1 | 5/2013 | Mori et al. |
| 2013/0160701 | A1 | 6/2013 | Arnold et al. |
| 2014/0008756 | A1 | 1/2014 | Pei et al. |
| 2014/0014975 | A1 | 1/2014 | Bae et al. |
| 2014/0015158 | A1 | 1/2014 | Cola |
| 2014/0057393 | A1 | 2/2014 | Bonart |
| 2014/0106508 | A1 | 4/2014 | Sutardja et al. |
| 2014/0131860 | A1 | 5/2014 | Kanda et al. |
| 2014/0321026 | A1 * | 10/2014 | Hermann ............ C01B 31/0233 361/502 |
| 2014/0321093 | A1 | 10/2014 | Pande |
| 2015/0008525 | A1 | 1/2015 | Fukuzaki et al. |
| 2015/0084103 | A1 | 3/2015 | Okazaki et al. |
| 2015/0129190 | A1 | 5/2015 | Lin |
| 2015/0136357 | A1 * | 5/2015 | Johnson ............... H01L 23/3735 165/80.3 |
| 2015/0137307 | A1 | 5/2015 | Stuber |
| 2015/0152239 | A1 | 6/2015 | Guilera Grandes et al. |
| 2015/0159969 | A1 * | 6/2015 | Lu ......................... F28F 13/00 165/104.19 |
| 2015/0162346 | A1 | 6/2015 | Choi et al. |
| 2015/0166921 | A1 | 6/2015 | Erdemir et al. |
| 2015/0187678 | A1 | 7/2015 | Park et al. |
| 2015/0218694 | A1 | 8/2015 | Xu et al. |
| 2015/0228628 | A1 | 8/2015 | Pagaila |
| 2015/0237762 | A1 | 8/2015 | Holt et al. |
| 2015/0255451 | A1 | 9/2015 | Yasusaka |
| 2015/0270356 | A1 | 9/2015 | Palacios et al. |
| 2015/0315442 | A1 | 11/2015 | Hofius |
| 2015/0325524 | A1 | 11/2015 | Wada et al. |
| 2015/0325531 | A1 | 11/2015 | Dyer et al. |
| 2015/0348865 | A1 | 12/2015 | Vincent et al. |
| 2016/0027717 | A1 | 1/2016 | Jang et al. |
| 2016/0152794 | A1 | 6/2016 | Diaham et al. |
| 2016/0197027 | A1 | 7/2016 | Nasser-faili |
| 2016/0215172 | A1 | 7/2016 | Morita et al. |
| 2016/0291256 | A1 * | 10/2016 | Rollinger ........... G02B 6/02042 |
| 2016/0379960 | A1 | 12/2016 | Huang et al. |
| 2016/0380090 | A1 * | 12/2016 | Roberts ................. H01L 22/32 257/76 |
| 2017/0338214 | A1 | 11/2017 | Uzoh et al. |

(56) References Cited

U.S. PATENT DOCUMENTS

FOREIGN PATENT DOCUMENTS

| EP | 2388810 | 11/2011 |
|---|---|---|
| JP | 2016000506 | 1/1916 |
| JP | 2002088257 | 3/2002 |
| JP | 2002097371 | 4/2002 |
| JP | 3159040 | 5/2010 |
| JP | 2010205955 | 9/2010 |
| JP | 2016000506 | 1/2016 |
| KR | 20130088223 | 8/2013 |
| KR | 20140132961 | 11/2014 |
| KR | 20140142382 | 12/2014 |

OTHER PUBLICATIONS

Sato et al., "Growth of diameter-controlled carbon nanotubes using monodisperse nickel nanoparticles obtained with a differential mobility analyzer"—2003, Chemical Phys. Lett. 382 (2003) 361-366.
Sabine Szunerits, et al.; "Diamond Nanowires: A Novel Platform for Electrochemistry and Matrix-Free Mass Spectrometry"; Sensors; ISSN 1424-8220; www.mdpi.com/journal/sensors; Apr. 19, 2015; Published: May 27, 2015; pp. 12573-12593.
International Search Report for PCT/US2017/063136 dated Apr. 5, 2018.
International Search Report for PCT/US2017/063131 dated Apr. 19, 2018.
Extended European Search Report for 17874089.0 dated Nov. 25, 2019.

\* cited by examiner

INTEGRATED CIRCUIT NANOPARTICLE THERMAL ROUTING STRUCTURE OVER INTERCONNECT REGION

FIELD OF THE INVENTION

This disclosure relates to the field of integrated circuits. More particularly, this disclosure relates to thermal management in integrated circuits.

BACKGROUND OF THE INVENTION

Integrated circuits frequently generate undesired heat in some active components. It is sometimes desired to remove the heat through a heat sink or other passive structure. It is sometimes desired to divert the heat from thermally sensitive components in the integrated circuit. Managing excess heat in integrated circuits has become increasingly problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit has a substrate and an interconnect region disposed above the substrate. The interconnect region has a plurality of interconnect levels, including a top interconnect level which includes interconnects. The integrated circuit has a thermal routing structure above the top interconnect level. The thermal routing structure extends over a portion, but not all, of the integrated circuit above the top interconnect level. The thermal routing structure includes a cohered nanoparticle film in which adjacent nanoparticles cohere to each other. The thermal routing structure has a thermal conductivity higher than dielectric material touching the thermal routing structure. The cohered nanoparticle film is formed by a method which includes an additive process.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent applications are related and hereby incorporated by reference: U.S. patent application Ser. No. 15/361,394, U.S. patent application Ser. No. 15/361,397, U.S. patent application Ser. No. 15/361,399, U.S. patent application Ser. No. 15/361,401, U.S. patent application Ser. No. 15/361,403, all filed simultaneously with this application. With their mention in this section, these patent applications are not admitted to be prior art with respect to the present invention.

Terms such as "top," "bottom," "front," "back," "over," "above," "under," "below," and such, may be used in this disclosure. These terms should not be construed as limiting the position or orientation of a structure or element, but should be used to provide spatial relationship between structures or elements.

For the purposes of this disclosure, the term "instant top surface" of an integrated circuit is understood to refer to the top surface of the integrated circuit which exists at the particular step being disclosed. The instant top surface may change from step to step in the formation of the integrated circuit.

For the purposes of this disclosure, the term "lateral" is understood to refer to a direction parallel to a plane of an instant top surface of the integrated circuit, and the term "vertical" is understood to refer to a direction perpendicular to the plane of the instant top surface of the integrated circuit.

Figure 1A:
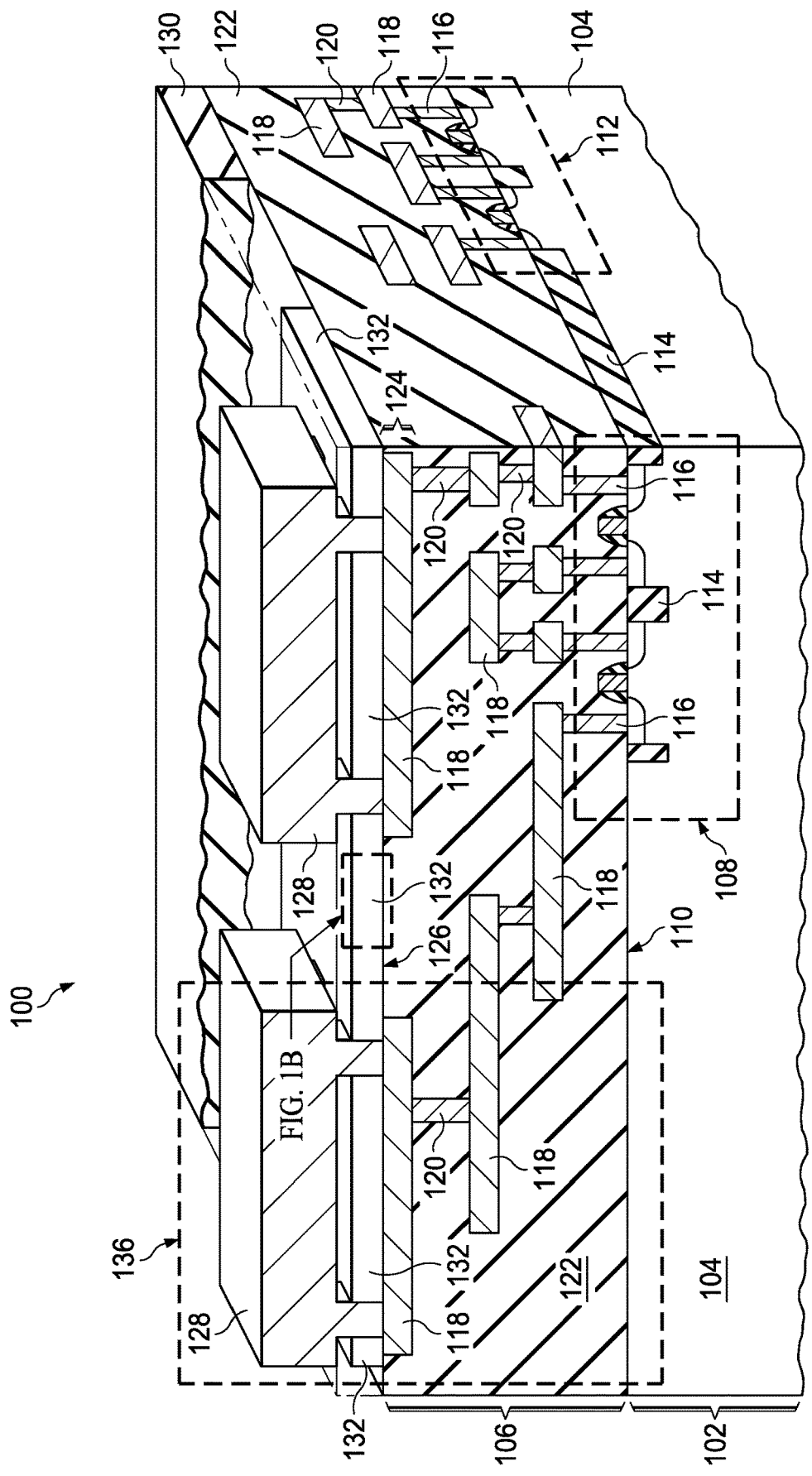
FIG. 1A and FIG. 1B are cross sections of an example integrated circuit according to an embodiment of the invention.
Figure 1B:
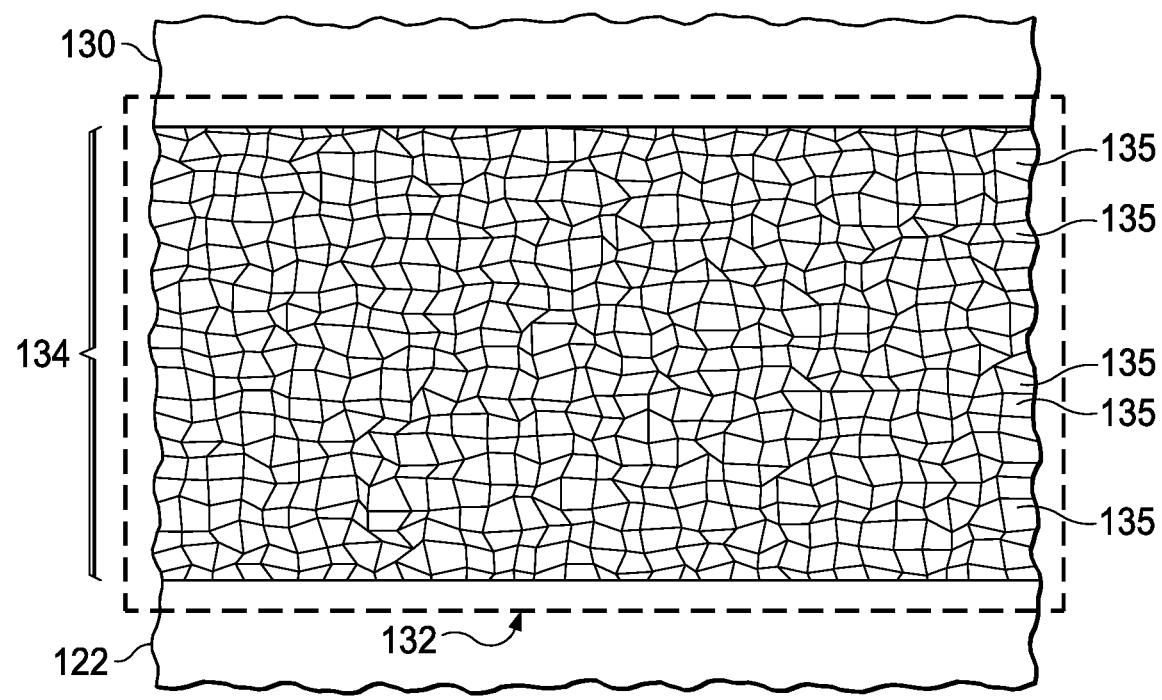

FIG. 1A and FIG. 1B are cross sections of an example integrated circuit according to an embodiment of the invention. Referring to FIG. 1A, the integrated circuit 100 includes a substrate 102 including a semiconductor material 104. The semiconductor material 104 may be a type IV semiconductor such as silicon, silicon germanium or silicon carbide. Alternatively, the semiconductor material 104 may be a type III-V semiconductor such as gallium nitride or gallium arsenide. Other semiconductor materials are within the scope of the instant example. The integrated circuit 100 further includes an interconnect region 106 disposed above the substrate 102. Heat-generating components 108 of the integrated circuit 100, depicted in FIG. 1A as metal oxide semiconductor (MOS) transistors, are disposed in the substrate 102, possibly extending into the interconnect region 106, proximate to a boundary 110 between the substrate 102 and the interconnect region 106. Other manifestations of the heat-generating components 108, such as bipolar junction transistors, junction field effect transistors (JFETs), resistors, and silicon controlled rectifiers (SCRs) are within the scope of the instant example. In the instant example, the integrated circuit 100 may also include thermally sensitive components 112, depicted in FIG. 1A as MOS transistors. Other manifestations of the thermally sensitive components 112 are within the scope of the instant example. The components may be laterally separated by field oxide 114 at the boundary 110 between the substrate 102 and the interconnect region 106. The field oxide 114 may have, for example, a shallow trench isolation (STI) structure as depicted in FIG. 1A, or may have a localized oxidation of silicon (LOCOS) structure.

The interconnect region 106 may include contacts 116, interconnects 118 and vias 120 disposed in a dielectric layer stack 122. The contacts 116 make electrical connections to the heat-generating components 108 and the thermally sensitive components 112. The interconnects 118 are disposed in a plurality of interconnect levels. The interconnects 118 in a first interconnect level make electrical connections to the contacts 116. The vias 120 are disposed between successive interconnect levels and make electrical connections to the interconnects 118. Some of the interconnects 118 are disposed in a top interconnect level 124 which is located proximate to a top surface 126 of the interconnect region 106. The top surface 126 of the interconnect region 106 is located at a surface of the interconnect region 106 opposite to the boundary 110 between the substrate 102 and the interconnect region 106. The interconnects 118 in the top interconnect level 124 may include aluminum interconnects, damascene copper interconnects, and/or plated copper interconnects. An aluminum interconnect may include an aluminum layer with a few percent silicon, titanium, and/or copper, possibly on an adhesion layer including titanium, and possibly with an anti-reflection layer of titanium nitride on the aluminum layer. A damascene copper interconnect may include copper on a barrier layer of tantalum and/or tantalum nitride, disposed in a trench in the dielectric layer stack 122. A plated copper interconnect may include an adhesion layer at a bottom of the interconnect, and may have a barrier layer disposed on the sides of the interconnect. Bond pad structures 128 may be disposed over the top surface 126 of the interconnect region 106, and may be electrically coupled to the interconnects 118 in the top interconnect level 124. A protective overcoat 130 may be disposed over the top surface 126 of the interconnect region 106. The protective overcoat 130 may abut the bond pad structure 128. The protective overcoat 130 may include one or more layers of dielectric material, such as silicon dioxide, silicon nitride, silicon oxide nitride, polyimide, and/or benzo-cyclobutene (BCB).

A thermal routing structure 132 is disposed over the top surface 126 of the interconnect region 106, extending over a portion, but not all, of the top surface 126. The thermal routing structure 132 has a higher thermal conductivity than dielectric material contacting the thermal routing structure 132. The dielectric material contacting the thermal routing structure 132 may include dielectric material of the dielectric layer stack 122 and/or dielectric material of the protective overcoat 130. Thermal conductivity may be understood as a property of a material, and may be expressed in units of watts/meter ° C. The thermal routing structure 132 includes a cohered nanoparticle film 134 including primarily nanoparticles 135, shown in more detail in FIG. 1B. Adjacent nanoparticles 135 in the cohered nanoparticle film 134 cohere to each other. There may be inorganic functional molecules, for example silane-based molecules including silicon and oxygen, on surfaces of the nanoparticles 135. The cohered nanoparticle film 134 is substantially free of an organic binder material such as adhesive or polymer. The thermal routing structure 132 may extend from an area over the heat-generating components 108 to a heat removal region 136 of the integrated circuit 100, as shown in FIG. 1A. The thermal routing structure 132 may be located outside an area over the thermally sensitive components 112, as shown in FIG. 1A, thus configured to advantageously divert heat from the heat-generating components 108 away from the thermally sensitive components 112 during operation of the integrated circuit 100.

In a version of the instant example as depicted in FIG. 1A and FIG. 1B, the thermal routing structure 132 may be electrically non-conductive, and the nanoparticles 135 may include nanoparticles of, for example, aluminum oxide, diamond, hexagonal boron nitride, cubic boron nitride, and/or aluminum nitride. The thermal routing structure 132 may touch the bond pad structures 128 without risking undesired electrical shunts between adjacent bond pad structures 128, advantageously enabling more complete coverage of the area over the heat-generating components 108 and in the heat removal region 136, to advantageously collect more heat from the heat-generating components 108, and more efficiently deliver the heat to the heat removal region 136.

In another version of the instant example, the thermal routing structure 132 may be electrically conductive. In such a version, the nanoparticles 135 may include nanoparticles of, for example, metal, graphene, graphene embedded in metal, graphite, graphitic carbon, and/or carbon nanotubes. Electrically conductive versions of the thermal routing structure 132 may be laterally separated from the bond pad structure 128 and may be vertically isolated from the interconnects 118 in the top interconnect level 124.

In a further version of the instant example, the nanoparticles 135 may include a metal suitable for catalysis of graphitic material, and the thermal routing structure 132 may include a layer of graphitic material on the cohered of nanoparticles 134. In such a version, the nanoparticles 135 may include, for example, copper, nickel, palladium, platinum, iridium, rhodium, cerium, osmium, molybdenum, and/or gold. The graphitic material may include graphite, graphitic carbon, graphene, and/or carbon nanotubes or the like. In such a version, the thermal routing structure 132 is electrically conductive, and hence may be laterally separated from the bond pad structure 128 and may be vertically isolated from the interconnects 118 in the top interconnect level 124.

Figure 2A:
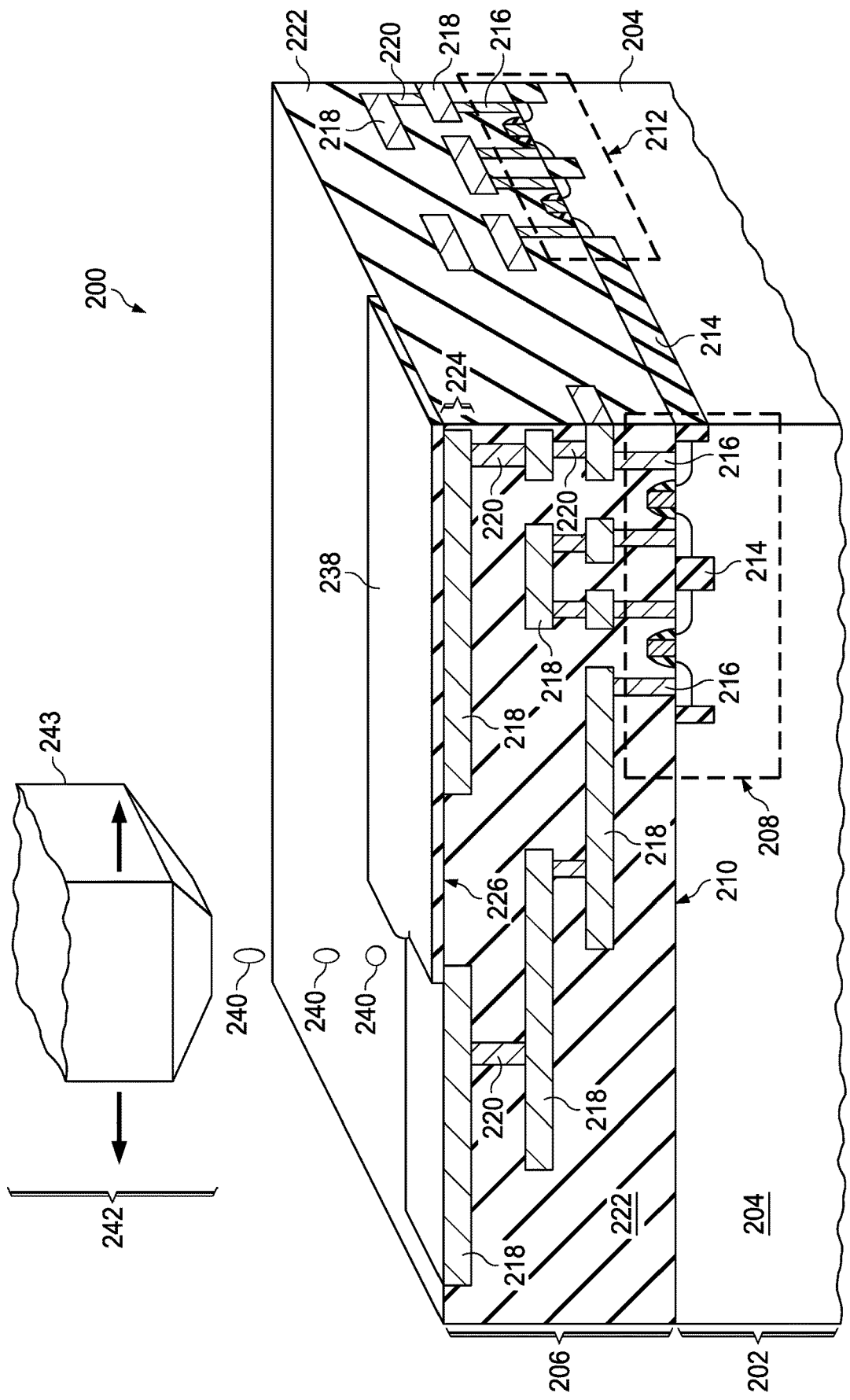
FIG. 2A through FIG. 2F depict an example method of forming an integrated circuit with a thermal routing structure of the type described in reference to FIG. 1A and FIG. 1B according to an embodiment of the invention.

FIG. 2A through FIG. 2F depict an example method of forming an integrated circuit with a thermal routing structure according to an embodiment of the invention. Referring to FIG. 2A, the integrated circuit 200 is formed on a substrate 202 which includes a semiconductor material 204. The substrate 202 may be, for example a semiconductor wafer. Components are formed in the semiconductor material 204, including heat-generating components 208 and, for example, thermally sensitive components 212. The components may include MOS transistors, bipolar junction transistors, JFETs, resistors, SCRs, diodes or such. Field oxide 214 may be formed in the substrate 202 to laterally separate the components. The field oxide 214 may be formed by an STI process or alternatively by a LOCOS process.

An interconnect region 206 is formed over the substrate 202. The interconnect region 206 may be formed as a series of dielectric layers to form a dielectric layer stack 222, with interconnect elements formed in each of the dielectric layers. A pre-metal dielectric (PMD) layer of the dielectric layer stack 222 may be formed directly over the substrate 202, and contacts 216 may be subsequently formed through the PMD layer to make electrical connections to the components, including the heat-generating components 208 and the thermally sensitive components 212. A first intra-metal dielectric (IMD) layer is formed as part of the dielectric layer stack 222. Interconnects 218 in a first interconnect level in the first IMD layer are formed over the PMD layer and the contacts 216. The interconnects 218 in the first interconnect level make electrical connections to the contacts 216. A first inter-level dielectric (ILD) layer is formed over the first IMD layer and first interconnect level, as part of the dielectric layer stack 222. Vias 220 are formed in the first ILD, making electrical connections to the interconnects 218 in the first interconnect level. Additional IMD layers with interconnects in sequential interconnect levels, and additional ILD layers with vias 220, are formed in the interconnect region 206, culminating in interconnects 218 in a top interconnect level 224. The top interconnect level 224 extends to a top surface 226 of the interconnect region 206.

Forming the thermal routing structure of the instant example begins with forming a first nanoparticle ink film 238 of a first nanoparticle ink 240 by a first additive process 242 over the top surface 226 of the interconnect region 206. For the purposes of this disclosure, an additive process may be understood to dispose the first nanoparticle ink 240 in a desired area and not dispose the first nanoparticle ink 240 outside of the desired area, so that it is not necessary to remove a portion of the first nanoparticle ink film 238 to produce a final desired shape of the first nanoparticle ink film 238. Additive processes may enable forming films in desired areas without photolithographic processes and subsequent etch processes, thus advantageously reducing fabrication cost and complexity. In one version of the instant example, the first nanoparticle ink film 238 may be formed directly on the top surface 226 of the interconnect region 206, as depicted in FIG. 2A. In an alternate version, one or more layers of a protective overcoat may be formed on the top surface 226 prior to forming the first nanoparticle ink film 238. The first nanoparticle ink 240 may include nanoparticles and a carrier fluid. The first nanoparticle ink 240 may be, for example, an ink, a slurry, a suspension, or a sol gel. The nanoparticles may include materials described for the nanoparticles 135 in reference to FIG. 1A and FIG. 1B. There may be inorganic functional molecules on surfaces of the nanoparticles to promote subsequent cohesion. A composition of the first nanoparticle ink 240 may be selected to provide a desired adhesion to the integrated circuit 200. The first nanoparticle ink 240 is dispensed onto the integrated circuit 200 in an area for the subsequently-formed thermal routing structure, and is not dispensed over an entirety of an instant top surface of the interconnect region 206. The first additive process 242 may include a discrete droplet process, sometimes referred to as an inkjet process, using a discrete droplet dispensing apparatus 243 as depicted in FIG. 2A. The discrete droplet dispensing apparatus 243 may be configured so that the integrated circuit 200 and the discrete droplet dispensing apparatus 243 may be moved laterally with respect to each other to provide a desired dispensing pattern for the first nanoparticle ink film 238. The discrete droplet dispensing apparatus 243 may have a plurality of dispensing ports which may be independently activated in parallel to provide a desired throughput for the first additive process 242. In an alternate version of the instant example, the first additive process 242 may include a continuous extrusion process, a direct laser transfer process, an electrostatic deposition process, or an electrochemical deposition process.

Figure 2B:
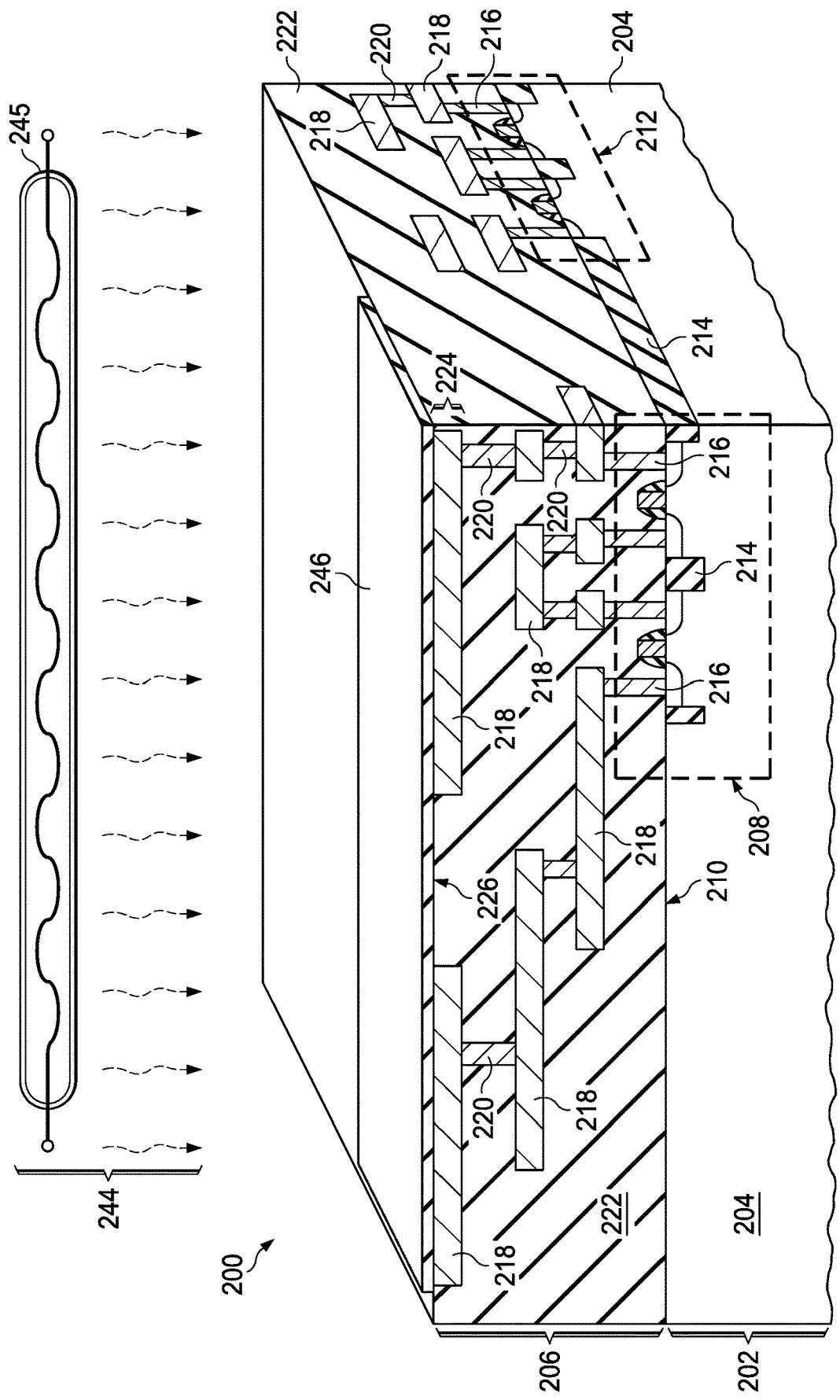

Referring to FIG. 2B, the first nanoparticle ink film 238 of FIG. 2A is heated by a first bake process 244 to remove at least a portion of a volatile material from the first nanoparticle ink film 238 to form a first nanoparticle film 246 which includes primarily nanoparticles. The first bake process 244 may be a radiant heat process, using, for example, an incandescent light source 245 as indicated schematically in FIG. 2B, or infrared light emitting diodes (IR LEDs). Alternatively, the first bake process 244 may be a hot plate process which heats the first nanoparticle ink film 238 through the substrate 202. The first bake process 244 may be performed in a partial vacuum, or in an ambient with a continuous flow of gas at low pressure, to enhance removal of the volatile material.

Figure 2C:
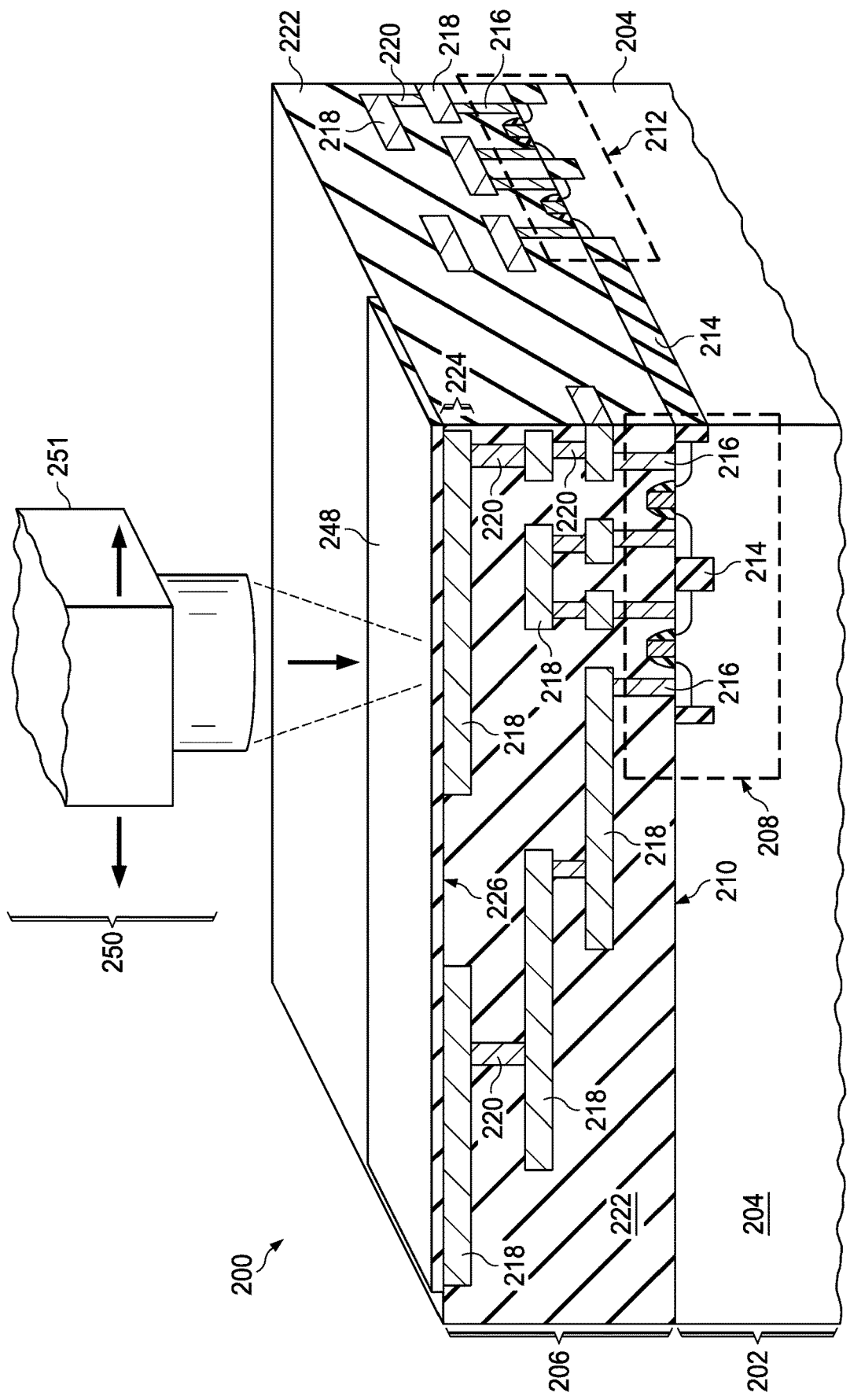

Referring to FIG. 2C, the first nanoparticle film 246 of FIG. 2B is heated by a first cohesion inducing process 250 so that adjacent nanoparticles cohere to each other, to form a first cohered nanoparticle film 248. The temperature required to induce cohesion between adjacent nanoparticles is a function of the size of the nanoparticles. Smaller nanoparticles may be heated at lower temperatures than larger nanoparticles to attain a desired cohesion. The nanoparticles may be selected to enable cohesion at a temperature compatible with the integrated circuit components and structures. Cohesion may occur by a process that includes a physical mechanism involving diffusion of atoms between the adjacent nanoparticles. Cohesion may also occur by a process that includes a chemical mechanism involving reaction of atoms between the adjacent nanoparticles. The first cohesion inducing process 250 may include heating by a scanning laser apparatus 251 as depicted schematically in FIG. 2C. The scanning laser apparatus 251 may be configured to provide heat to substantially only the first nanoparticle film 246 and not provide heat to portions of the integrated circuit 200 laterally adjacent to the first nanoparticle film 246, advantageously reducing a total heat load on the components 208 and 212.

In one variation of the instant example, the first cohesion inducing process 250 may include a flash heating process, which applies radiant energy for 1 microsecond to 10 microseconds. In another variation, the first cohesion inducing process 250 may include a spike heating process, which applies radiant energy for 100 milliseconds to 5 seconds. In an alternate version of the instant example, the first bake process 244 described in reference to FIG. 2B may be combined with the first cohesion inducing process 250, wherein thermal power applied to the first nanoparticle film 246 of FIG. 2B is ramped to first remove the volatile material, followed by inducing cohesion of the nanoparticles. Other methods of inducing cohesion between the nanoparticles are within the scope of the instant example.

Figure 2D:
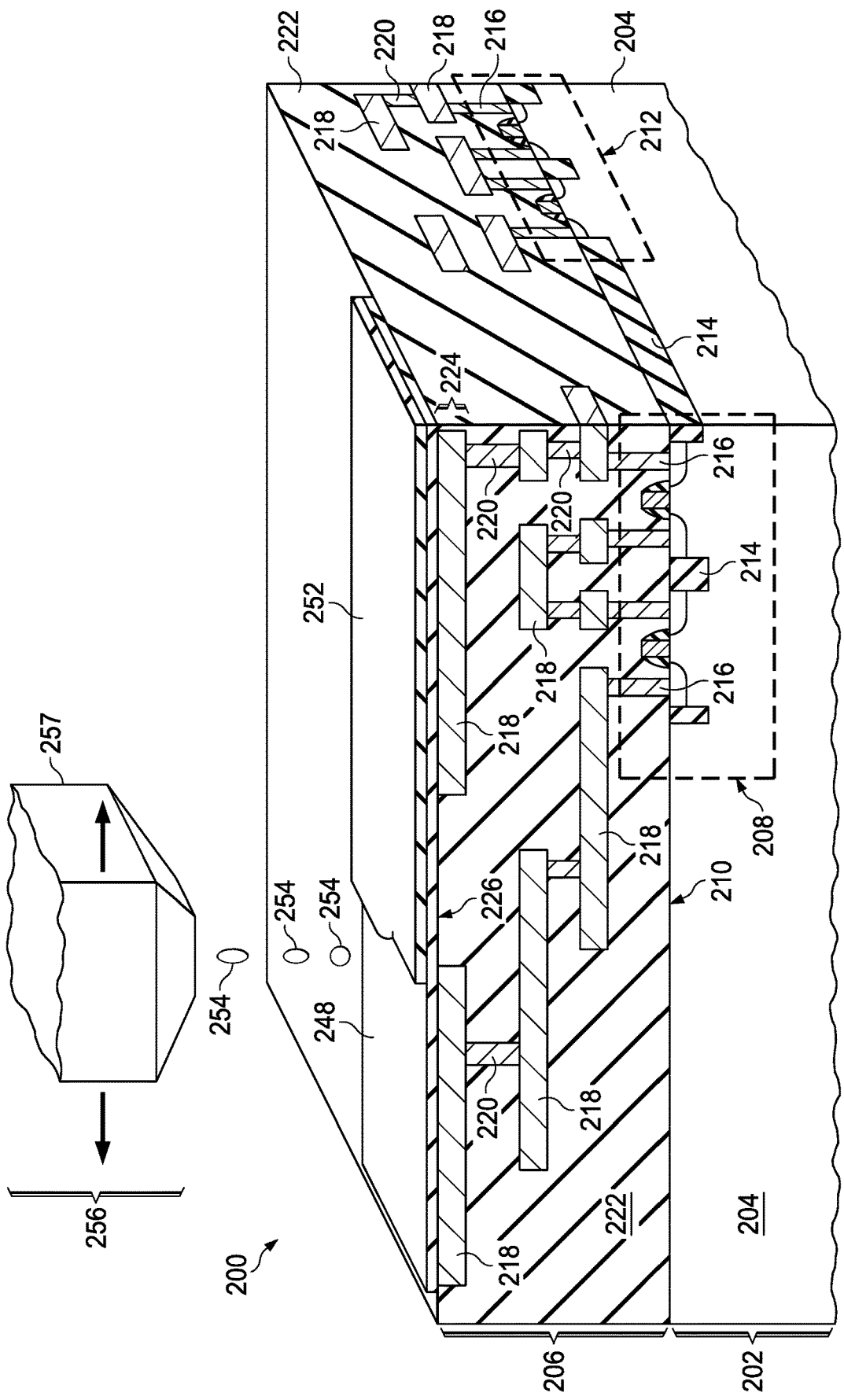

Referring to FIG. 2D, forming the thermal routing structure of the instant example continues with forming a second nanoparticle ink film 252 by dispensing a second nanoparticle ink 254 on the first cohered nanoparticle film 248. The second nanoparticle ink 254 may be, for example, an ink, a slurry, or a sol gel. The second nanoparticle ink 252 may have substantially a same composition as the first nanoparticle ink film 238 of FIG. 2A. Alternatively, the second nanoparticle ink film 252 may have a different composition from the first nanoparticle ink film 238, for example selected to provide a desired thermal conductivity. The second nanoparticle ink 254 is dispensed onto the first cohered nanoparticle film 248 by a second additive process 256. The second additive process 256 may use the same type of apparatus used by the first additive process 242 described in reference to FIG. 2A, for example a discrete droplet dispensing apparatus 257 as depicted in FIG. 2D. Alternatively, the second additive process 256 may use a different apparatus or may use a different process, especially if the composition of the second nanoparticle ink film 252 is different from the composition of the first nanoparticle ink film 238.

Figure 2E:
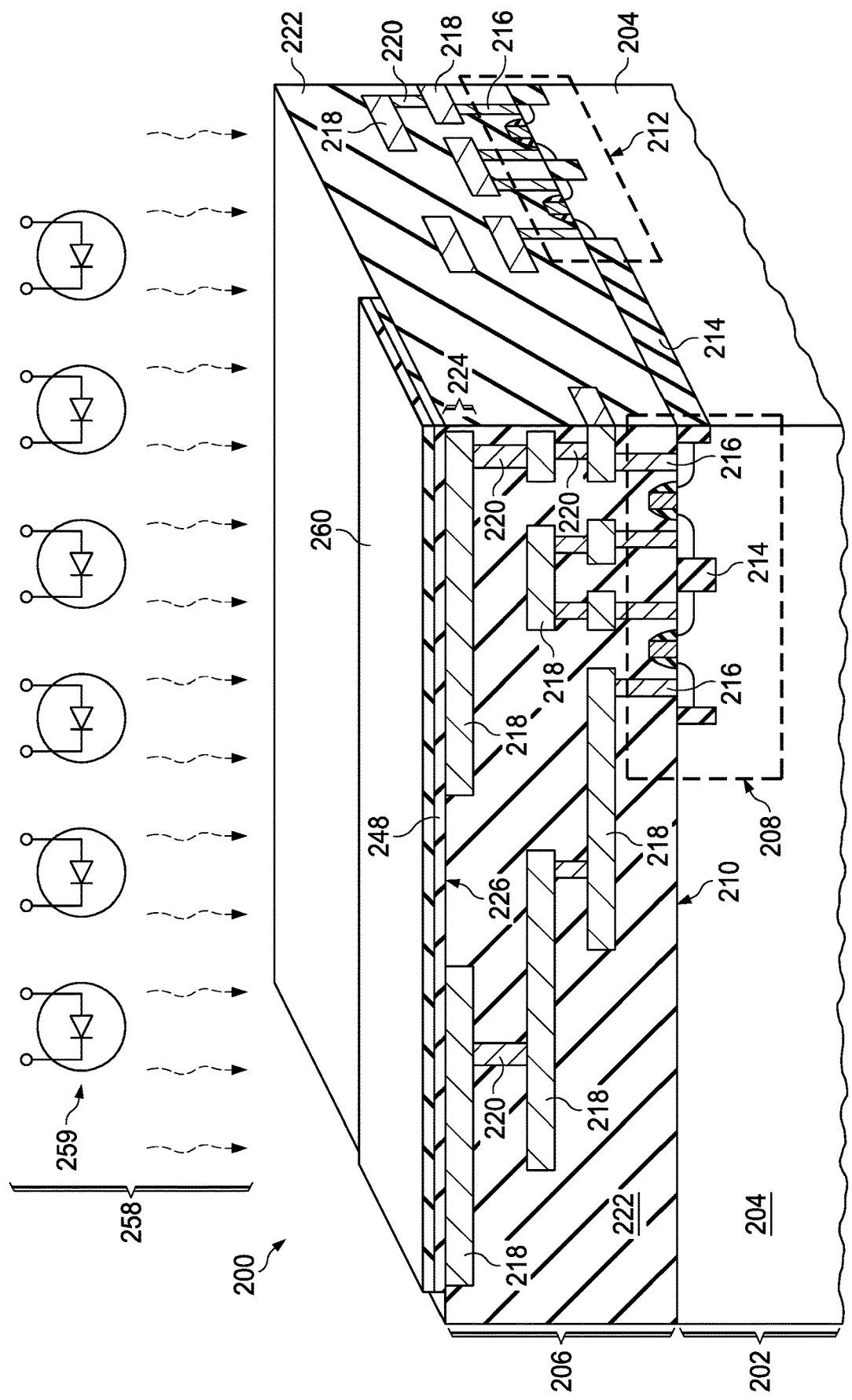

Referring to FIG. 2E, the second nanoparticle ink film 252 of FIG. 2D is heated by a second bake process 258 to remove at least a portion of a volatile material from the second nanoparticle ink film 252 to form a second nanoparticle film 260. The second nanoparticle film 260 includes primarily nanoparticles. The second bake process 258 may use IR LEDs 259 as depicted schematically in FIG. 2E. Using the IR LEDs 259 may enable application of the radiant heat to substantially only an area containing the second nanoparticle ink film 252 while not applying the radiant heat to areas of the integrated circuit 200 outside of the second nanoparticle ink film 252, advantageously reducing a heat load on the components 208 and 212. Alternatively, the second bake process 258 may be include a radiant heat process using an incandescent source, or may include a hot plate process. The second bake process 258 may optionally be performed at a higher temperature or for a longer time than the first bake process 244.

Figure 2F:
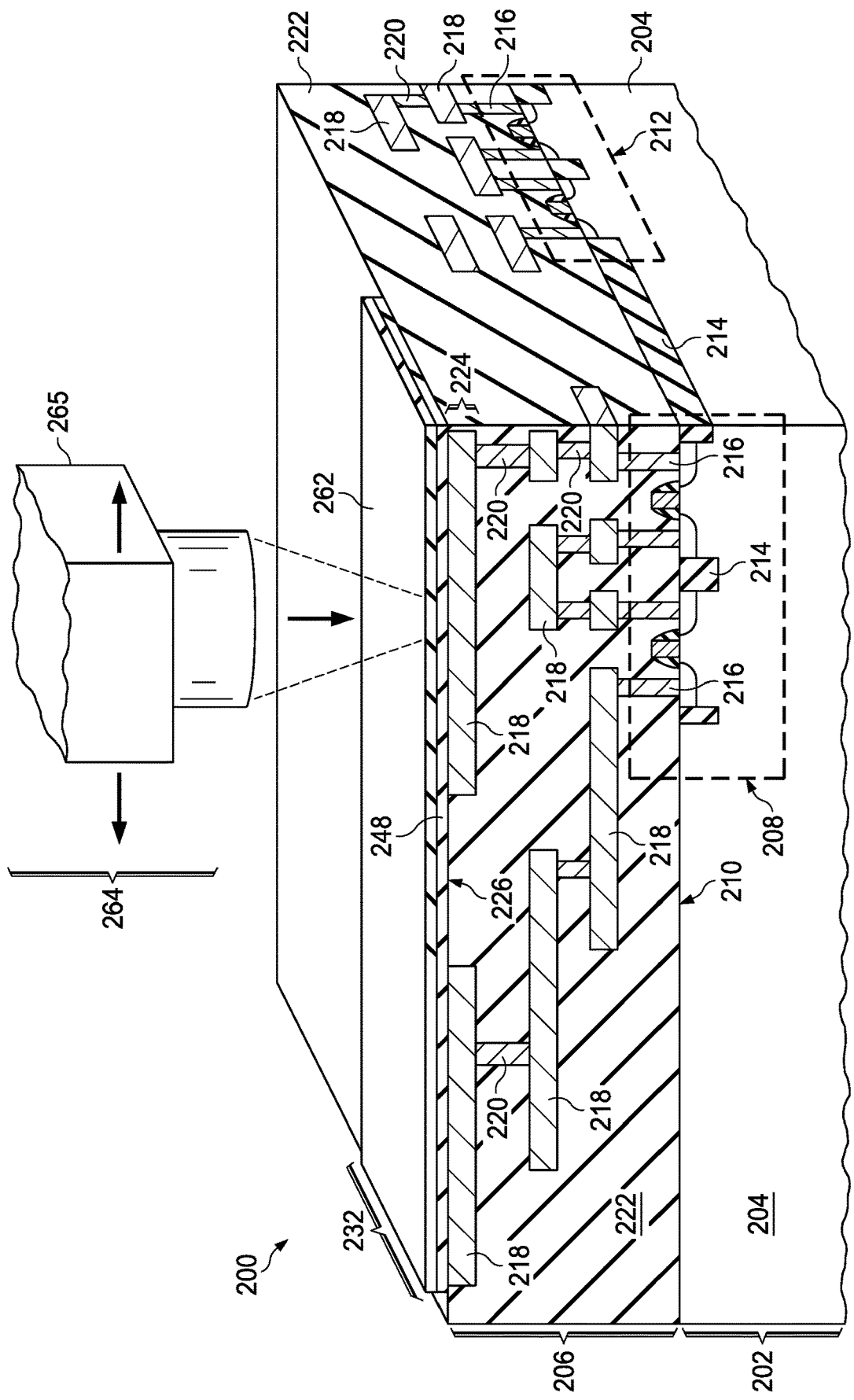

Referring to FIG. 2F, the second nanoparticle film 260 of FIG. 2E is heated by a second cohesion inducing process 264 so that adjacent nanoparticles in the second nanoparticle film 260 cohere to each other, to form a second cohered nanoparticle film 262 over the first cohered nanoparticle film 248. The second cohesion inducing process 264 may be similar to the first cohesion inducing process 250, for example a second scanned laser heating process using a scanning laser apparatus 265. Further cohesion of the nanoparticles in the first cohered nanoparticle film 248 may be induced by the second cohesion inducing process 264.

The first cohered nanoparticle film 248 and the second cohered nanoparticle film 262 may provide the thermal routing structure 232. Alternatively, additional nanoparticle ink films may be formed, baked, and heated to induce nanoparticle cohesion, to combine with the first cohered nanoparticle film 248 and the second cohered nanoparticle film 262 to provide the thermal routing structure 232.

Figure 3A:
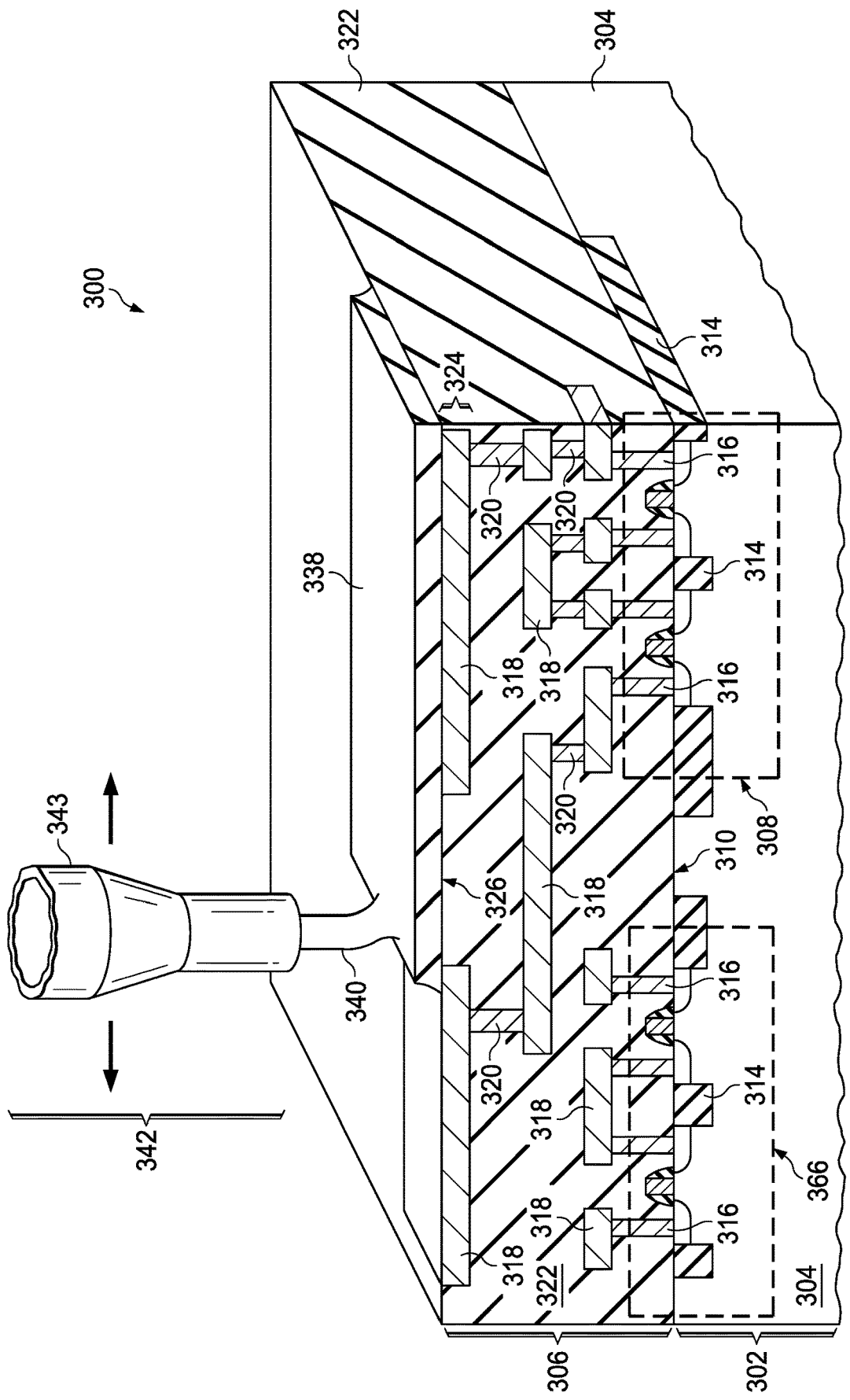
FIG. 3A through FIG. 3C depict another example method of forming an integrated circuit with a thermal routing structure of the type described in reference to FIG. 1A and FIG. 1B according to an embodiment of the invention.
Figure 3B:
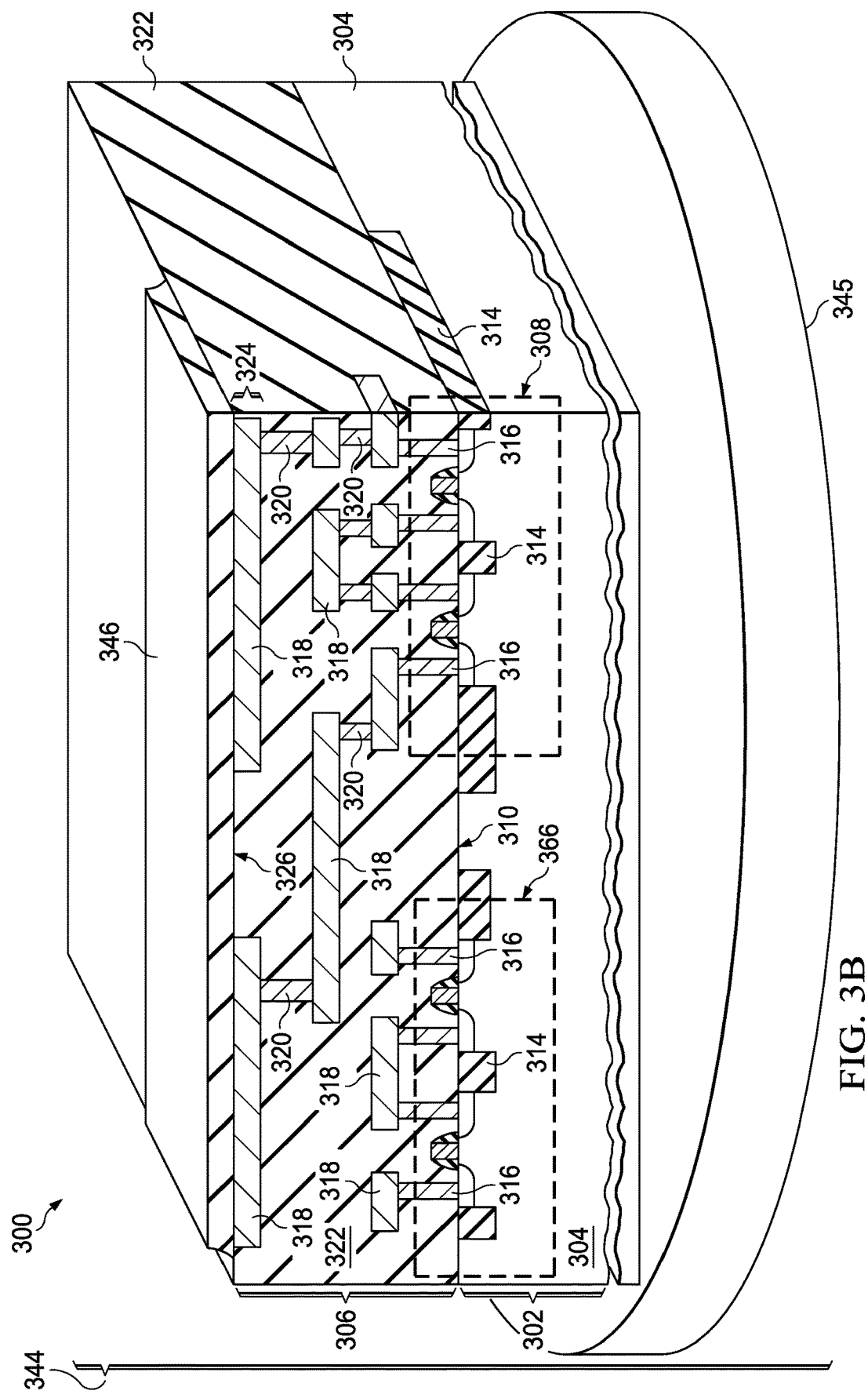
Figure 3C:
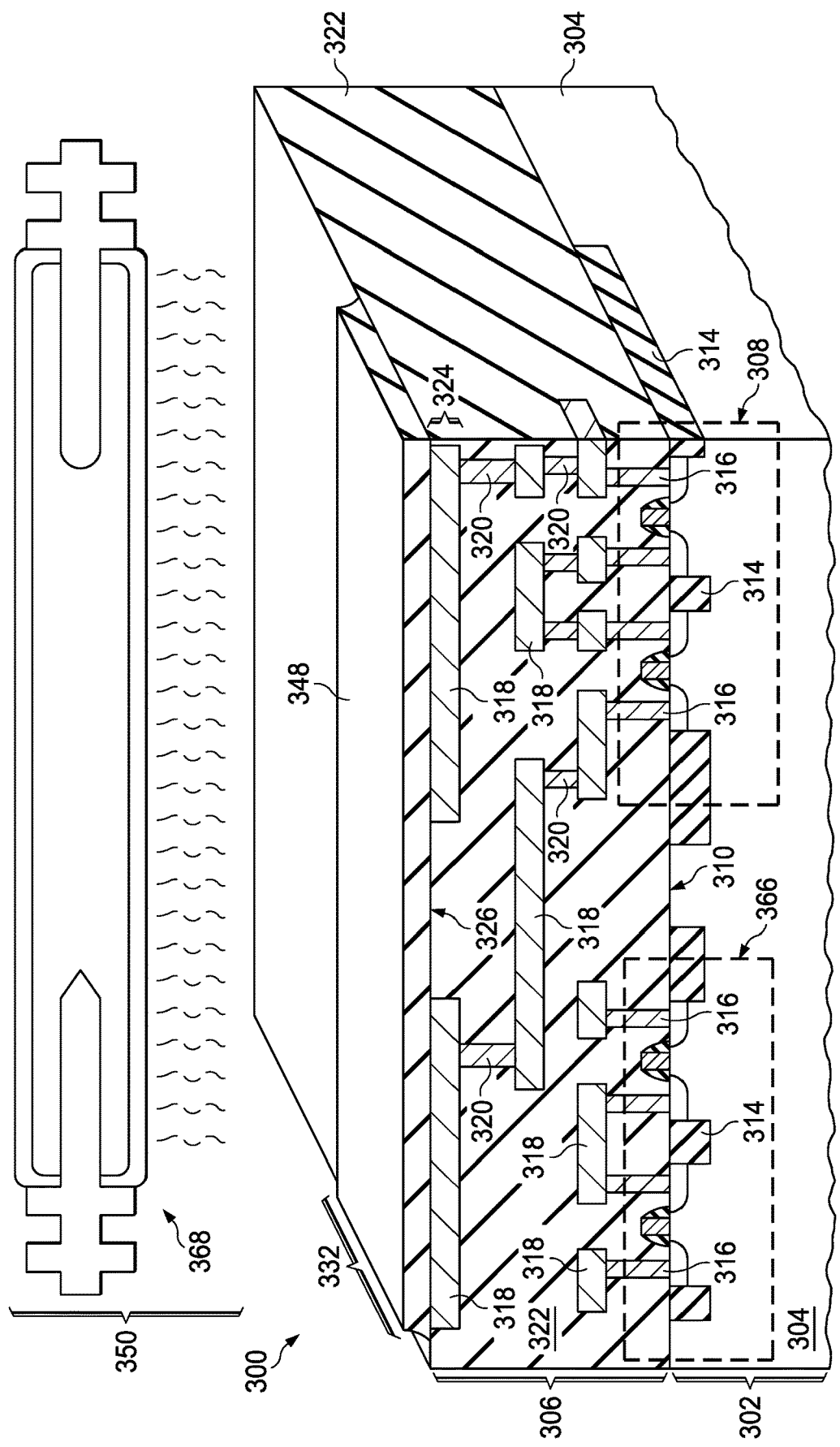

FIG. 3A through FIG. 3C depict another example method of forming an integrated circuit with a thermal routing structure according to an embodiment of the invention. Referring to FIG. 3A, the integrated circuit 300 is formed on a substrate 302 which includes a semiconductor material 304. Components are formed in the semiconductor material 304, proximate to a top surface 310 of the substrate 302. The components of the instant example may include, for example, a first set of components 308 and a second set of components 366, wherein the first set of components 308 is spatially separated from the second set of components 366, and wherein the first set of components 308 and the second set of components 366 benefit from sharing a same thermal environment. The first set of components 308 and the second set of components 366 may be matching components of an analog circuit. Matching components may be understood as components which are designed to have substantially equal performance parameters such as drive current and threshold. Because these performance parameters are affected by temperature, reducing a temperature difference between matching components may advantageously reduce differences in the performance parameters. The components 308 and 366 may include MOS transistors, bipolar junction transistors, JFETs, resistors, SCRs, diodes or the like. Field oxide 314 may be formed in the substrate 302 to laterally separate the components. The field oxide 314 may be formed by an STI process or alternatively by a LOCOS process.

An interconnect region 306 is formed over the substrate 302. The top surface 310 of the substrate 302 is also a boundary between the substrate 302 and the interconnect region 306. The interconnect region 306 may be formed as a series of dielectric layers, such as a PMD layer, and alternating IMD layers and ILD layers, to form a dielectric layer stack 322, with interconnect elements such as contacts 316, interconnects 318, and vias 320 formed in the dielectric layers. A portion of the interconnects 318 are disposed in a top interconnect level 324. The top interconnect level 324 extends proximate to a top surface 326 of the interconnect region 306. The top surface 326 of the interconnect region 306 is located at a surface of the interconnect region 306 opposite to the boundary 310 between the substrate 302 and the interconnect region 306.

Forming the thermal routing structure of the instant example begins with forming a nanoparticle ink film 338 of a nanoparticle ink 340 by an additive process 342 over the top surface 326 of the interconnect region 306. In one version of the instant example, the nanoparticle ink film 338 may be formed directly on the top surface 326, as depicted in FIG. 3A. The nanoparticle ink 340 of the instant example includes nanoparticles and a carrier fluid. The nanoparticle ink 340 is dispensed onto the integrated circuit 300 in an area for the subsequently-formed thermal routing structure, and is not dispensed over the entire top surface 326 of the interconnect region 306. The additive process 342 may include a continuous extrusion process, using a micro-extrusion dispensing apparatus 343 as depicted in FIG. 3A. The micro-extrusion dispensing apparatus 343 may be configured so that the integrated circuit 300 and the micro-extrusion dispensing apparatus 343 may be moved laterally with respect to each other to provide a desired dispensing pattern for the nanoparticle ink film 338. In the instant example, the micro-extrusion dispensing apparatus 343 may form the nanoparticle ink film 338 thick enough to form the thermal routing structure without need for additional nanoparticle ink films.

Referring to FIG. 3B, the nanoparticle ink film 338 of FIG. 3A is heated by a bake process 344 to remove at least a portion of a volatile material from the nanoparticle ink film 338 to form a nanoparticle film 346 which includes primarily nanoparticles. The bake process 344 may be a hot plate process using a hot plate 345 disposed under the substrate 302. Alternatively, the bake process 344 may be a radiant heat process, as described in reference to FIG. 2B or FIG. 2E. The bake process 344 may be performed in a partial vacuum, or in an ambient with a continuous flow of gas at low pressure, to enhance removal of the volatile material.

Referring to FIG. 3C, the nanoparticle film 346 of FIG. 3B is heated by a cohesion inducing process 350 so that adjacent nanoparticles cohere to each other, to form a cohered nanoparticle film 348. The cohesion inducing process 350 may include a flash heating process 350 using a flash lamp 368, as depicted schematically in FIG. 3C. Other methods of inducing cohesion between the nanoparticles are within the scope of the instant example. The cohered nanoparticle film 348 may provide substantially all of the thermal routing structure 332. Alternatively, additional cohered nanoparticle films may be formed to combine with the cohered nanoparticle film 348 to provide the thermal routing structure 332.

Figure 4B:
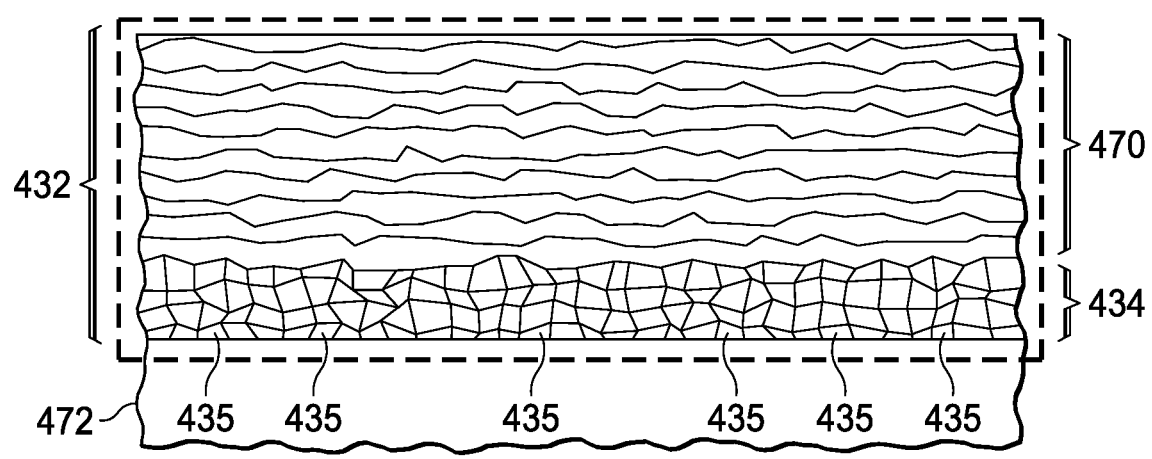
FIG. 4A and FIG. 4B are cross sections of another example integrated circuit according to an embodiment of the invention.
Figure 4A:
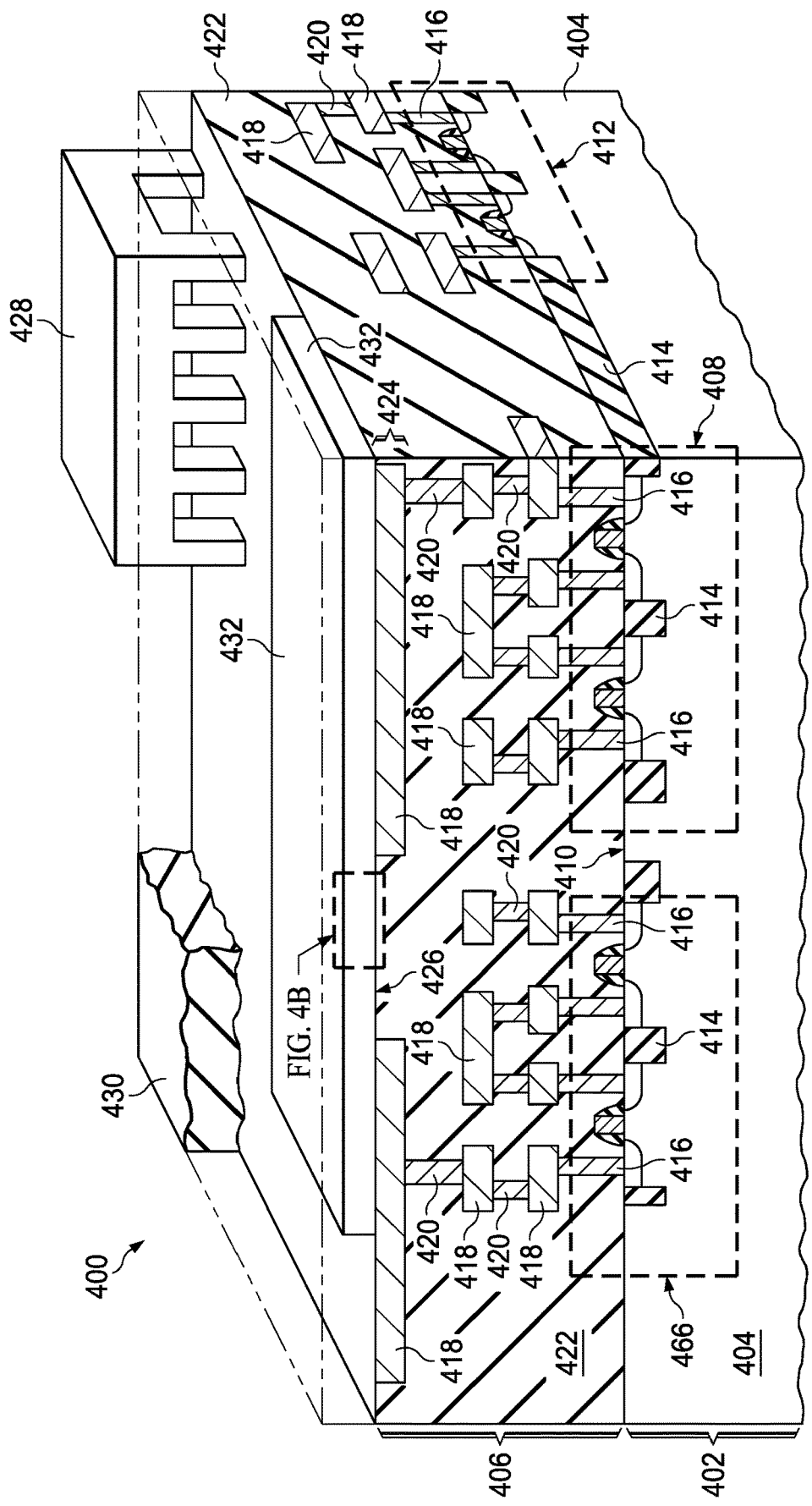

FIG. 4A and FIG. 4B are cross sections of another example integrated circuit according to an embodiment of the invention. Referring to FIG. 4A, the integrated circuit 400 includes a substrate 402 including a semiconductor material 404. The integrated circuit 400 further includes an interconnect region 406 disposed above the substrate 402. In the instant example, a first set of components 408 and a second set of components 466 are disposed in the substrate 402, proximate to a boundary 410 between the substrate 402 and the interconnect region 406. In the instant example, the first set of components 408 and the second set of components 466 may be matching components whose performance benefits from having similar thermal environments. The integrated circuit 400 may further include thermally sensitive components 412 whose performance improves as an operating temperature decreases. The components 408, 466 and 412 are depicted in FIG. 4A as MOS transistors, however other manifestations, such as bipolar junction transistors, JFETs, resistors, and SCRs are within the scope of the instant example. The components 408, 466 and 412 may be laterally separated by field oxide 414 at the boundary 410 between the substrate 402 and the interconnect region 406.

The interconnect region 406 may include contacts 416, interconnects 418 and vias 420 disposed in a dielectric layer stack 422. Some of the interconnects 418 are disposed in a top interconnect level 424 which is located at a top surface 426 of the interconnect region 406. The top surface 426 of the interconnect region 406 is located at a surface of the interconnect region 406 opposite to the boundary 410 between the substrate 402 and the interconnect region 406. Bond pad structures 428 may be disposed over the top surface 426 of the interconnect region 406. The bond pad structures 428 are electrically coupled to the interconnects 418 in the top interconnect level 424. A protective overcoat 430 may be disposed over the top surface 426 of the interconnect region 406. The bond pad structures 428 may extend through the protective overcoat 430.

A thermal routing structure 432 is disposed over the top surface 426 of the interconnect region 406, extending over a portion, but not all, of the top surface 426. In the instant example, the thermal routing structure 432 includes a cohered nanoparticle film 434 including nanoparticles 435 which include metal, and a layer of graphitic material 470 disposed on the cohered nanoparticle film 434, shown in detail in FIG. 4B. The metal in the nanoparticles 435 may include, for example, copper, nickel, palladium, platinum, iridium, rhodium, cerium, osmium, molybdenum, and/or gold. The layer of graphitic material 470 may include graphite, graphitic carbon, graphene, carbon nanotubes or the like.

A dielectric isolation layer 472 may optionally be disposed under the cohered nanoparticle film 434. The dielectric isolation layer 472 may electrically isolate the cohered nanoparticle film 434 from underlying interconnects 418 in the top interconnect level 424.

In the instant example, the thermal routing structure 432 may extend over the first set of components 408 and the second set of components 466, and may extend away from the thermally sensitive components 412, as shown in FIG. 4A. Thus, the thermal routing structure 432 may provide a more closely matched thermal environment for the first set of components 408 and the second set of components 466 and thereby improve their performance, while advantageously diverting heat from the first set of components 408 and the second set of components 466 away from the thermally sensitive components 412.

Figure 5A:
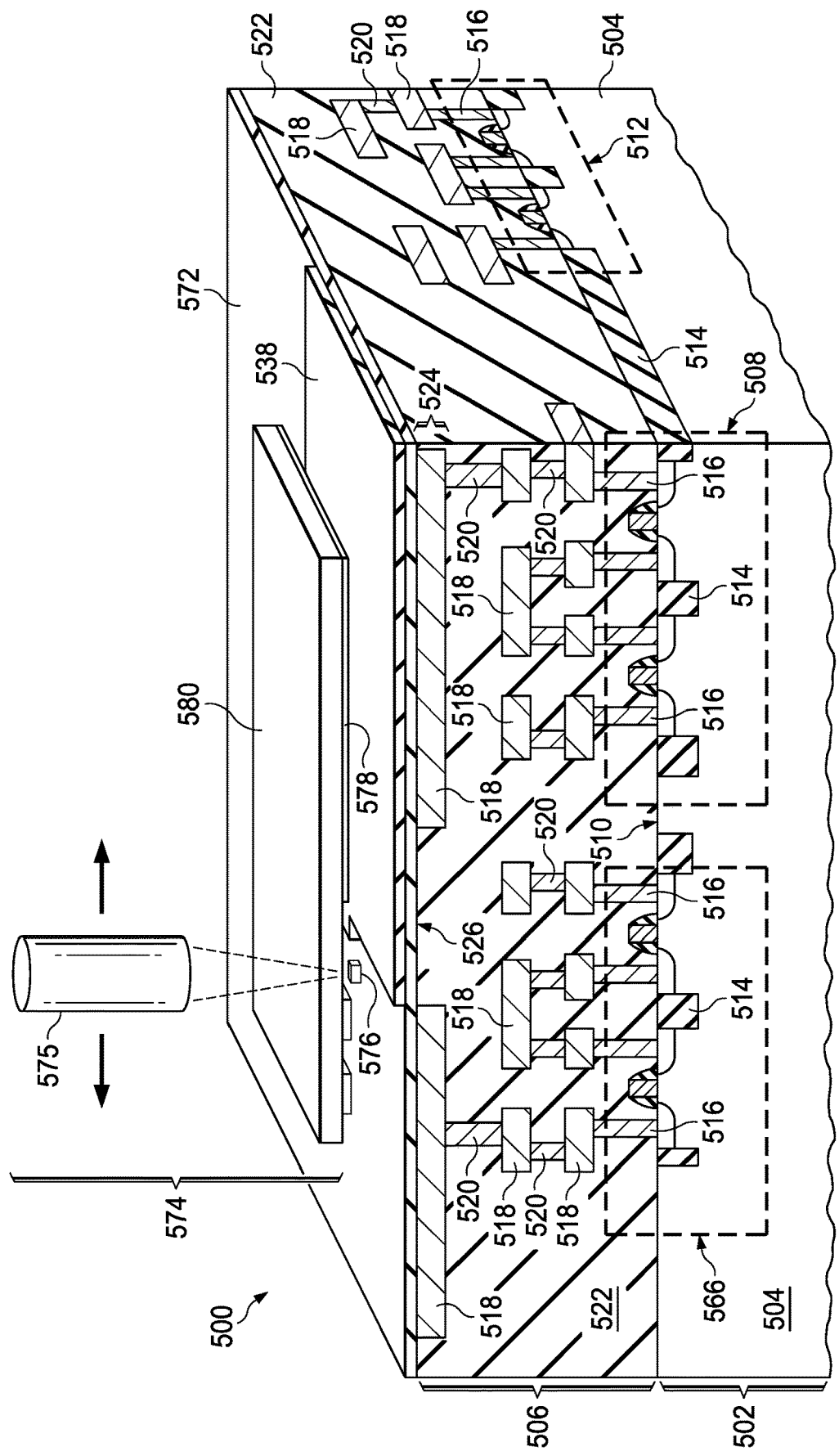
FIG. 5A through FIG. 5D depict an example method of forming an integrated circuit with a thermal routing structure of the type described in reference to FIG. 4A and FIG. 4B according to an embodiment of the invention.

FIG. 5A through FIG. 5D depict another example method of forming an integrated circuit with a thermal routing structure according to an embodiment of the invention. Referring to FIG. 5A, the integrated circuit 500 is formed on a substrate 502 which includes a semiconductor material 504. Components including, for example, heat-generating components 508, thermally sensitive components 512 and matching components 566, are formed in the semiconductor material 504 proximate to a top surface 510 of the substrate 502. Field oxide 514 may be formed proximate to the top surface 510 of the substrate 502 to laterally separate the components 508, 512 and 566. An interconnect region 506 is formed over the substrate 502. The top surface 510 of the substrate 502 is also a boundary between the substrate 502 and the interconnect region 506. The interconnect region 506 may be formed to have a dielectric layer stack 522, with interconnect elements such as contacts 516, interconnects 518, and vias 520 formed in the dielectric layer stack 522, for example as described in reference to FIG. 2A. A portion of the interconnects 518 are disposed in a top interconnect level 524 which extends proximate to a top surface 526 of the interconnect region 506. The top surface 526 of the interconnect region 506 is located at a surface of the interconnect region 506 opposite to the boundary 510 between the substrate 502 and the interconnect region 506.

Forming the thermal routing structure of the instant example may optionally begin with forming a dielectric isolation layer 572 over the top surface 526 of the interconnect region 506. The purpose of the dielectric isolation layer 572 is to electrically isolate the thermal routing structure, which is electrically conductive, from the interconnects 518 in the top interconnect level 524. The dielectric isolation layer 572 may be formed as a blanket layer extending over the entire top surface 526 of the interconnect region 506, as depicted in FIG. 5A. Alternatively, the dielectric isolation layer 572 may be formed as a patterned layer, covering an area for the thermal routing structure. The dielectric isolation layer 572 may include, for example, silicon dioxide, silicon nitride, or other inorganic dielectric material. The dielectric isolation layer 572 may be formed by a variety of methods, including a plasma enhanced chemical vapor deposition (PECVD) process using tetraethyl orthosilicate (TEOS). In one version of the instant example, a patterned manifestation of the dielectric isolation layer 572 may be formed of electrically non-conductive nanoparticles having a higher thermal conductivity than an underlying dielectric material, using an additive process according to the methods described in reference to FIG. 2A through FIG. 2F, or FIG. 3A through FIG. 3C. A patterned dielectric isolation layer 572 including thermally conductive nanoparticles would advantageously increase an overall thermal conductivity of the thermal routing structure.

Forming the thermal routing structure continues with forming a nanoparticle ink film 538 containing nanoparticles which include metal, by an additive process 574 over the dielectric isolation layer 572. The nanoparticles may include the metals disclosed in reference to FIG. 4A and FIG. 4B, or other metal suitable as a catalyst for subsequent growth of graphitic material. The nanoparticle ink film 538 is formed in an area for the subsequently-formed thermal routing structure, and is not formed over the entire top surface 526 of the interconnect region 506. The additive process 574 may include a direct laser transfer process using a pulsed laser 575 to transfer small pieces of nanoparticle ink 576 from a nanoparticle ink layer 578 to the integrated circuit 500. The nanoparticle ink layer 578 is attached to a backing layer 580. The combined nanoparticle ink layer 578 and backing layer 580 are sometimes referred to as a ribbon. The pulsed laser 575, the nanoparticle ink layer 578 and backing layer 580, and the integrated circuit 500 may be moved relative to each other to form the nanoparticle ink film 538 in a desired area. In alternate versions of the instant example, the nanoparticle ink film 538 may be formed by dispensing a nanoparticle ink, for example as described in reference to FIG. 2A through FIG. 2F, or FIG. 3A through FIG. 3C.

Figure 5B:
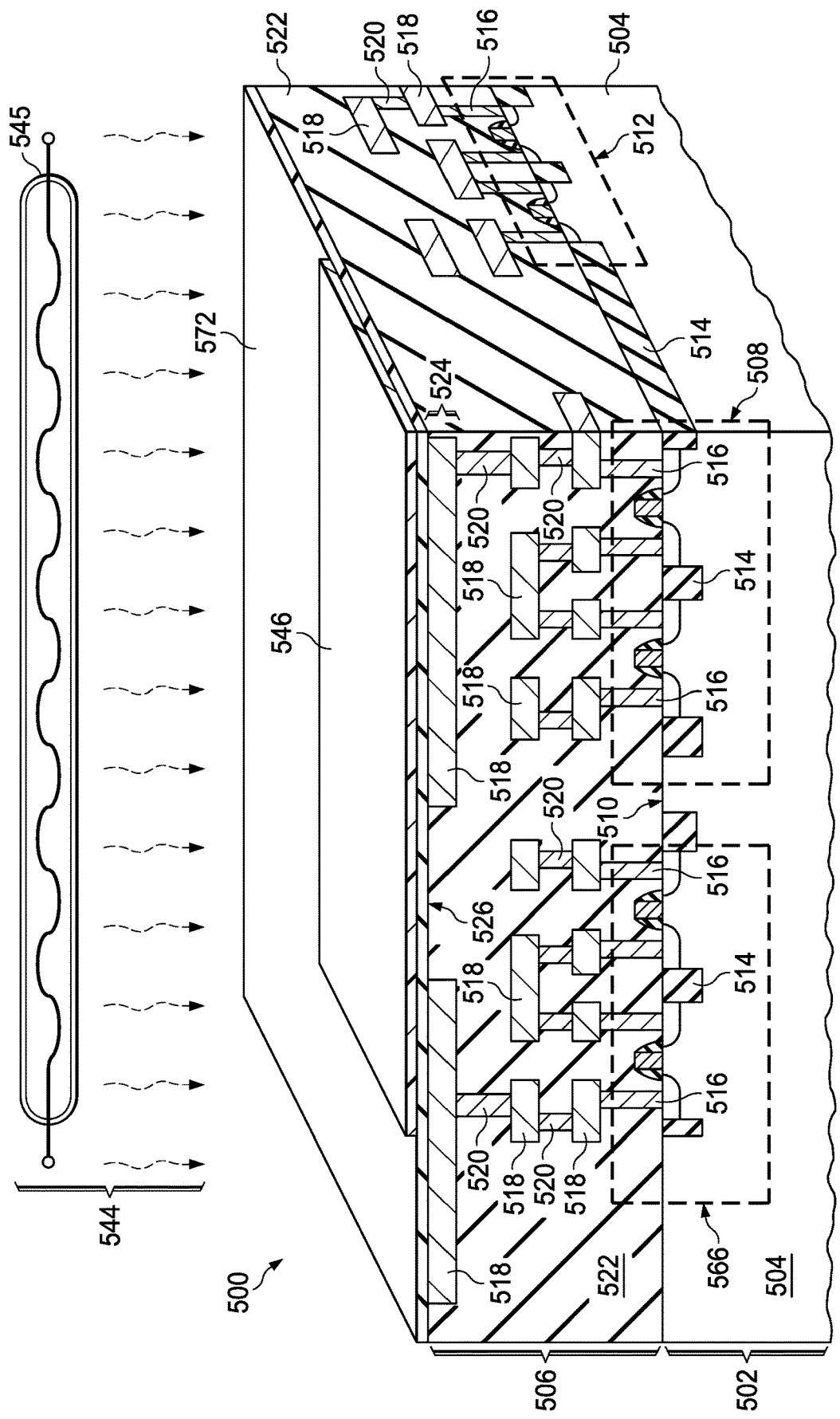

Referring to FIG. 5B, the nanoparticle ink film 538 of FIG. 5A is heated by a bake process 544 to remove at least a portion of a volatile material from the nanoparticle ink film 538 to form a nanoparticle film 546 which includes primarily nanoparticles. The bake process 544 may be a radiant heat process using an incandescent lamp 545, as indicated schematically in FIG. 5B. Other manifestations of the bake process 544 are within the scope of the instant example.

Figure 5C:
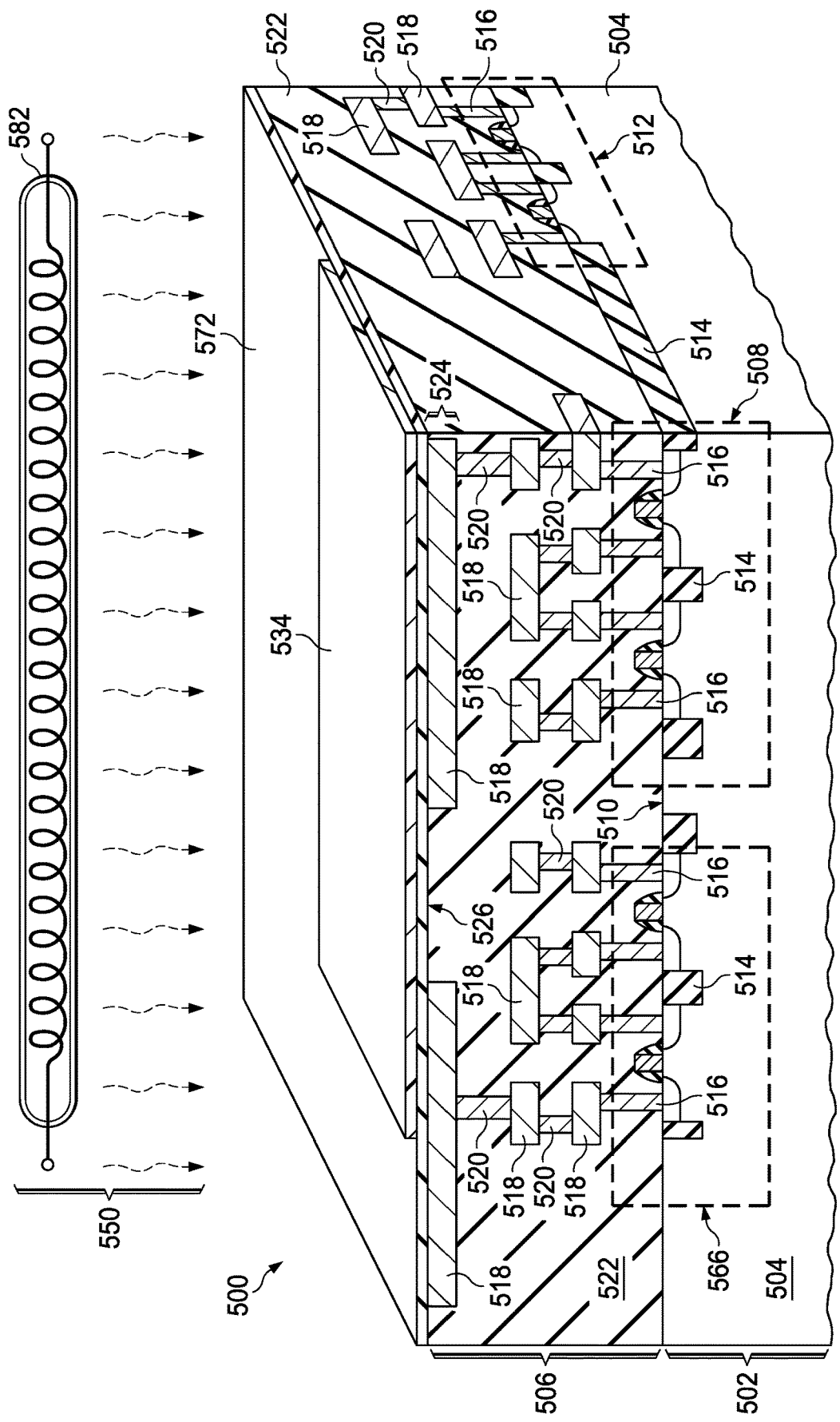

Referring to FIG. 5C, the nanoparticle film 546 of FIG. 5B is heated by a cohesion inducing process 550 so that adjacent nanoparticles cohere to each other, to form a cohered nanoparticle film 534. The cohesion inducing process 550 may include a spike heating process using an incandescent lamp 582, as depicted schematically in FIG. 5C. The spike heating process heats the nanoparticle film 546 for a time duration of, for example, 1 millisecond to 10 milliseconds, to advantageously limit heating of the components 508, 512 and 566. Other methods of inducing cohesion between the nanoparticles are within the scope of the instant example.

Figure 5D:
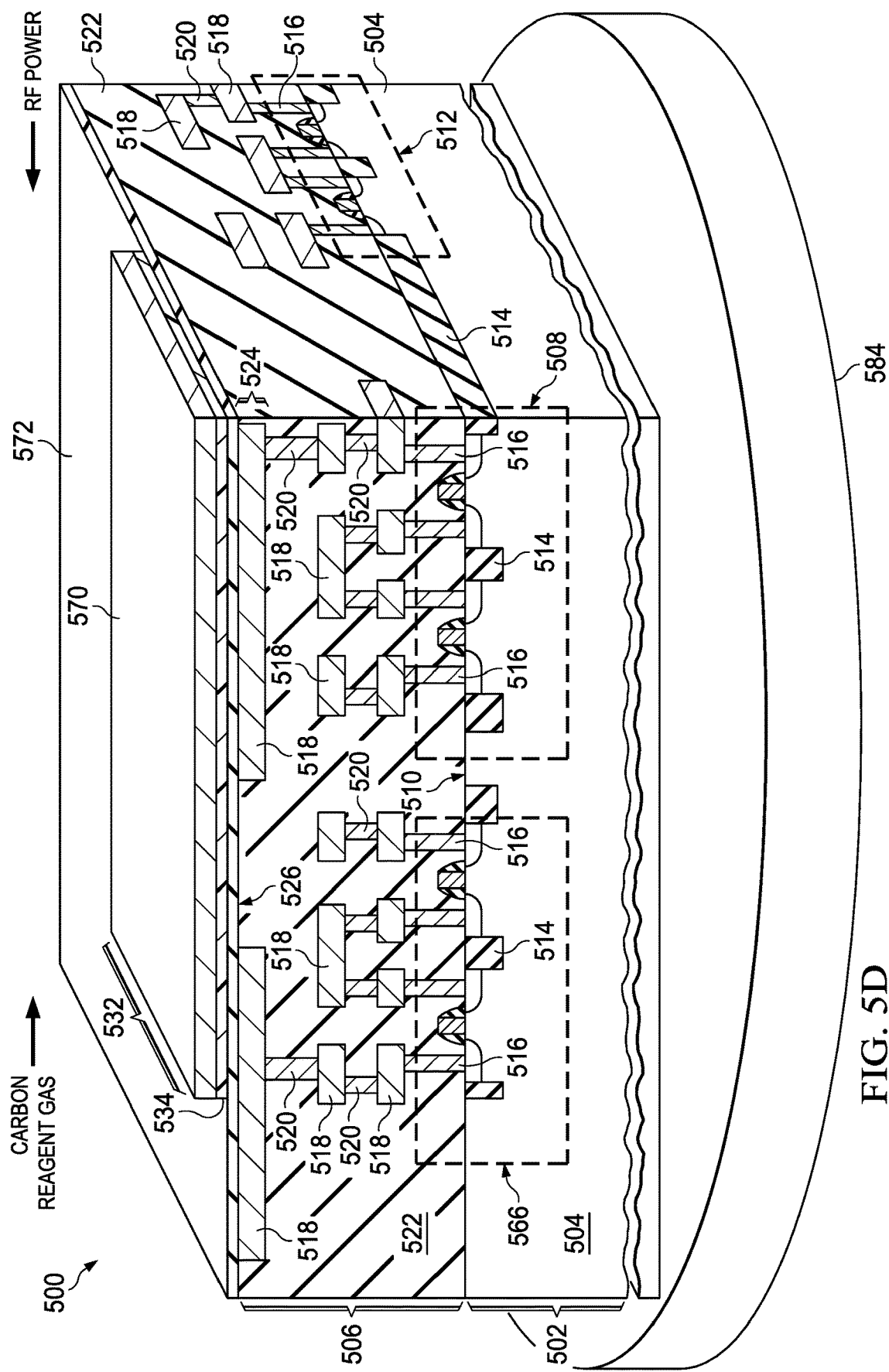

Referring to FIG. 5D, a layer of graphitic material 570 is selectively formed on the cohered nanoparticle film 534 by a graphitic material PECVD process. In the graphitic material PECVD process, the substrate 502 is disposed on a wafer chuck 584 and is heated by the wafer chuck 584, for example to a temperature of 200° C. to 400° C. A carbon-containing reagent gas, denoted in FIG. 5D as "CARBON REAGENT GAS" is flowed over the integrated circuit 500 and radio frequency (RF) power, denoted in FIG. 5D as "RF POWER" is applied to the carbon-containing reagent gas to generate carbon radicals above the integrated circuit 500. The carbon-containing reagent gas may include methane, straight chain alkanes such as ethane, propane and/or butane, alcohols such as ethanol, and/or cyclic hydrocarbons such as cyclobutane or benzene. Additional gases such as hydrogen, argon and/or oxygen may also be flowed over to the integrated circuit 500. The metal in the nanoparticles in the cohered nanoparticle film 534 catalyze the carbon radicals to react to form the graphitic material, so that a first layer of the layer of graphitic material 570 is formed selectively on the cohered nanoparticle film 534. Subsequent layers of the graphitic material are formed selectively on the previously formed layers of graphitic material, so that the layer of graphitic material 570 is formed selectively on the cohered nanoparticle film 534, and the graphitic material 570 is not formed on the integrated circuit 500 outside of the cohered nanoparticle film 534. The combined cohered nanoparticle film 534 and the layer of graphitic material 570 provide the thermal routing structure 532.

Figure 6:
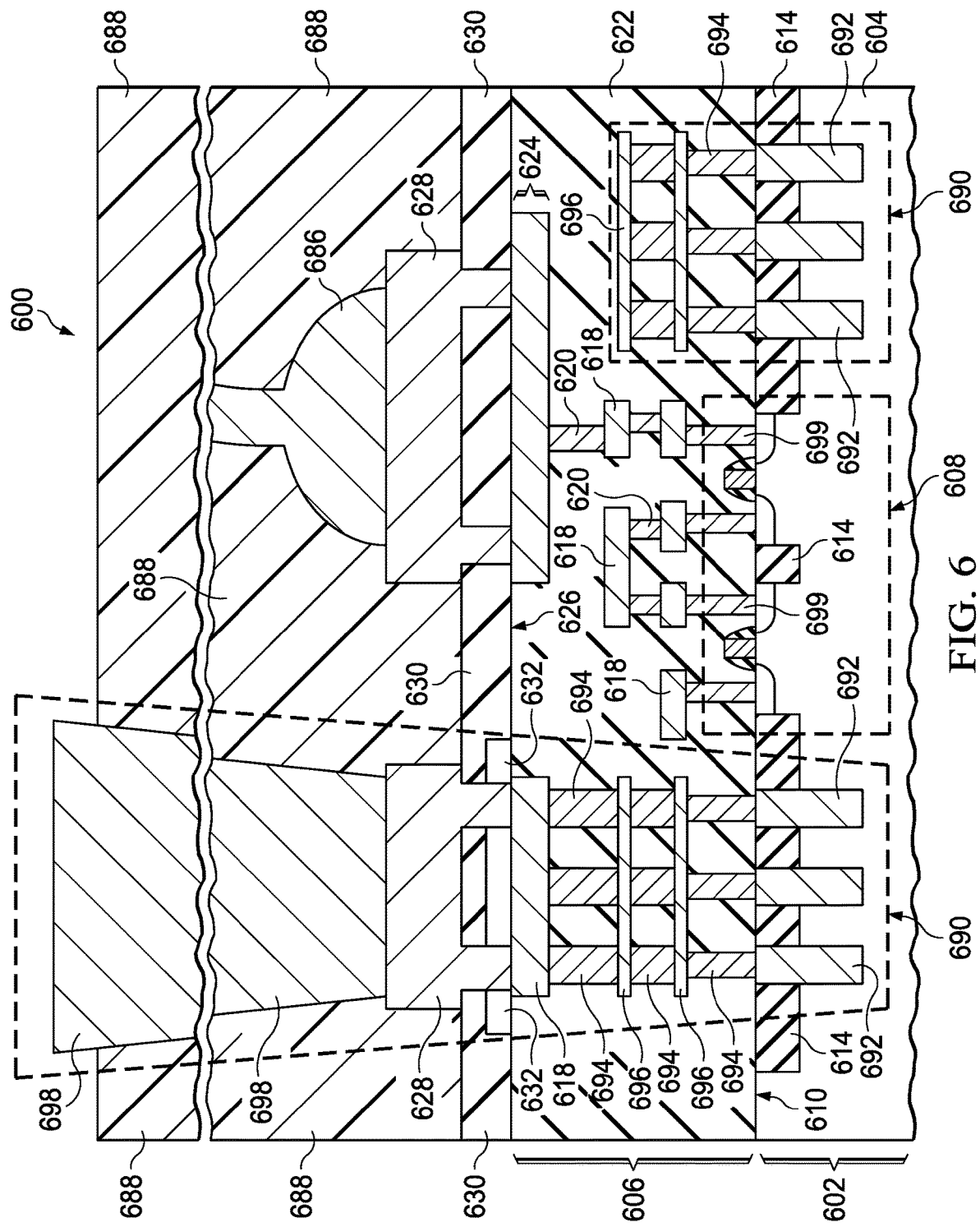
FIG. 6 is a cross section of an example integrated circuit which includes a combined thermal routing structure according to an embodiment of the invention.

FIG. 6 is a cross section of an example integrated circuit which includes a combined thermal routing structure according to an embodiment of the invention. The integrated circuit 600 includes a substrate 602 including a semiconductor material 604. The integrated circuit 600 further includes an interconnect region 606 disposed above the substrate 602. Components 608 are disposed in the substrate 602 and the interconnect region 606, at a boundary 610 between the substrate 602 and the interconnect region 606. The components 608 may be, for example, MOS transistors, bipolar junction transistors, JFETs, resistors, and/or SCRs. The components 608 may be laterally separated by field oxide 614 at the boundary 610 between the substrate 602 and the interconnect region 606. The interconnect region 606 may include contacts 616, interconnects 618 and vias 620 disposed in a dielectric layer stack 622. Some of the interconnects 618 are disposed in a top interconnect level 624 which is located at a top surface 626 of the interconnect region 606. The top surface 626 of the interconnect region 606 is located opposite from the boundary 610 between the substrate 602 and the interconnect region 606. Bond pad structures 628 are disposed over the top surface 626 of the interconnect region 606, and are electrically coupled to the interconnects 618 in the top interconnect level 624. A protective overcoat 630 is disposed over the top surface 626 of the interconnect region 606.

In the instant example, the integrated circuit 600 is assembled using wire bonds 686 on some of the bond pad structures 628. The integrated circuit 600 is packaged by encapsulation in an encapsulation material 688. The encapsulation material 688, which may be an epoxy for example, is disposed over the protective overcoat 630 and the bond pads structures 628.

The integrated circuit 600 of the instant example includes the combined thermal routing structure 690, which extends from inside the substrate 602 through the interconnect region 606, and through the organic polymer encapsulation material 688. The combined thermal routing structure 690 includes a thermal routing structure 632 disposed above the top interconnect level 624 according to any of the examples herein. The combined thermal routing structure 690 may conduct heat generated by the components 608 to a heat removal apparatus, such as a heat sink, located outside of a package containing the integrated circuit 600, which may advantageously reduce an operating temperature of the components 608.

The combined thermal routing structure 690 may include deep trench thermal routing structures 692 disposed in the substrate 602 and extending to the boundary 610 between the substrate 602 and the interconnect region 606. The deep trench thermal routing structures 692 may surround a portion of the components 608 and may be connected to each other at locations out of the plane of FIG. 6. The deep trench thermal routing structures 692 may have structures and may be formed, for example, as described in the commonly assigned patent application having patent application Ser. No. 15/361,397, filed simultaneously with this application, and which is incorporated herein by reference.

The combined thermal routing structure 690 may include high thermal conductivity vias 694 disposed in the interconnect region 606. The high thermal conductivity vias 694 may surround a portion of the components 608 and may be connected to each other at locations out of the plane of FIG. 6. The high thermal conductivity vias 694 may have structures and may be formed, for example, as described in the commonly assigned patent application having patent application Ser. No. 15/361,399, filed simultaneously with this application, and which is incorporated herein by reference.

The combined thermal routing structure 690 may include high thermal conductivity lateral structures 696 disposed in the interconnect region 606. The high thermal conductivity lateral structures 696 may surround a portion of the components 608 and may be connected to each other at locations out of the plane of FIG. 6. The high thermal conductivity lateral structures 696 may have structures and may be formed, for example, as described in the commonly assigned patent application having patent application Ser. No. 15/361, 394, filed simultaneously with this application, and which is incorporated herein by reference.

The combined thermal routing structure 690 may include high thermal conductivity through-package conduits 698 disposed through the encapsulation material 688 to the integrated circuit 600. The high thermal conductivity through-package conduits 698 may have structures and may be formed, for example, as described in the commonly assigned patent application having patent application Ser. No. 15/361,403, filed simultaneously with this application, and which is incorporated herein by reference.

The integrated circuit 600 may further include graphitic vias 699 which are electrically coupled to the components 608. The graphitic vias 699 may conduct heat generated by the components 608 away from the substrate, possibly to the combined thermal routing structure 690, which may advantageously reduce an operating temperature of the components 608. The graphitic vias 699 may have structures and may be formed, for example, as described in the commonly assigned patent application having patent application Ser. No. 15/361,401, filed simultaneously with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a substrate including a semiconductor material;
an interconnect region above the substrate, the interconnect region including:
a dielectric layer stack;
contacts in the dielectric layer stack;
interconnects in the dielectric layer stack, at least two of the interconnects being in a top interconnect level of the interconnect region, proximate to a top surface of the interconnect region, opposite from a boundary between the substrate and the interconnect region; and
vias in the dielectric layer stack;
a heat-generating component in the substrate and the interconnect region, proximate to the boundary between the substrate and the interconnect region;
a thermal routing structure above the top interconnect level and extending over the heat-generating component and over a portion of the top interconnect level, the thermal routing structure including a first cohered nanoparticle film over the top surface of the interconnect region, the first cohered nanoparticle film including first electrically non-conductive nanoparticles, the thermal routing structure including a second cohered nanoparticle film over the first cohered nanoparticle film, the second cohered nanoparticle film including second electrically non-conductive nanoparticles, and the first and second cohered nanoparticle films being essentially free of an organic binder material; and
a dielectric material over the top interconnect level and contacting the thermal routing structure, a thermal conductivity of the thermal routing structure being higher than a thermal conductivity of the dielectric material.

2. The integrated circuit of claim 1, wherein the first electrically non-conductive nanoparticles include a material selected from the group consisting of aluminum oxide, diamond, hexagonal boron nitride, cubic boron nitride, and aluminum nitride.

3. The integrated circuit of claim 2, bond pad structures contacting the thermal routing structure.

4. The integrated circuit of claim 1, further comprising a heat removal region, the thermal routing structure extending to the heat removal region.

5. The integrated circuit of claim 1, further comprising a thermally sensitive component, the thermal routing structure extending away from the thermally sensitive component.

6. The integrated circuit of claim 1, further comprising matching components, the thermal routing structure extending over the matching components.

7. The integrated circuit of claim 1, further comprising a thermal routing component selected from the group consisting of a deep trench thermal routing structure, a high thermal conductivity via, a high thermal conductivity lateral structure, a high thermal conductivity through-package conduit, and a graphitic via;
the deep trench thermal routing structure including a cohered nanoparticle film, and the deep trench thermal routing structure being disposed in the substrate and extending to the boundary between the substrate and the interconnect region;
the high thermal conductivity via including a cohered nanoparticle film, and the high thermal conductivity via being disposed in the interconnect region;
the high thermal conductivity lateral structure including a cohered nanoparticle film, and the high thermal conductivity lateral structure being disposed in the interconnect region;
the high thermal conductivity through-package conduit including a cohered nanoparticle film, and the high thermal conductivity through-package conduit being disposed through an encapsulation material over the integrated circuit and extending to the integrated circuit; and
the graphitic via including a cohered nanoparticle film, and the graphitic via being electrically coupled to one of the heat-generating components.

8. The integrated circuit of claim 1, wherein the first and second electrically non-conductive nanoparticles are formed of a same type of nanoparticle material.

9. The integrated circuit of claim 1, wherein the first electrically non-conductive nanoparticles are formed of a different type of nanoparticle material than the second electrically non-conductive nanoparticles.

10. The integrated circuit of claim 9, wherein a thermal conductivity of the first cohered nanoparticle film is different from a thermal conductivity of the second cohered nanoparticle film.

11. A method of forming an integrated circuit, the method comprising:
providing a substrate including a semiconductor material;
forming a heat-generating component in the substrate;
forming an interconnect region above the substrate, including by:
forming a dielectric layer stack above the substrate;
forming contacts in the dielectric layer stack, the contacts making electrical connections to the heat-generating component;
forming interconnects in the dielectric layer stack, the interconnects being formed in interconnect levels, at least two of the interconnects being located in a first interconnect level and making electrical connections to the contacts, and a portion of the interconnects being located in a top interconnect level at a top surface of the interconnect region opposite from the substrate; and forming vias in the dielectric layer stack, the vias making electrical connections to the interconnects; and forming a thermal routing structure, including by:
dispensing a first nanoparticle ink by an additive process on the integrated circuit over the top interconnect level to form a first nanoparticle ink film including first electrically non-conductive nanoparticles and a first carrier fluid;
inducing cohesion of the first electrically non-conductive nanoparticles to form a first cohered nanoparticle film;
dispensing a second nanoparticle ink by an additive process on the first cohered nanoparticle film to form a second nanoparticle ink film, the second nanoparticle ink film including second electrically non-conductive nanoparticles and a second carrier fluid, and the first and second nanoparticle ink films being free of an organic binder material; and
inducing cohesion of the second electrically non-conductive nanoparticles to form a second cohered nanoparticle film over the first cohered nanoparticle film; and forming a dielectric isolation layer over the top interconnect level before forming the first nanoparticle ink film, a thermal conductivity of the thermal routing structure being higher than a thermal conductivity of the dielectric isolation layer.

12. The method of claim 11, wherein forming the thermal routing structure includes heating the first nanoparticle ink film to remove a volatile material to form the first cohered nanoparticle film, before inducing cohesion of the first electrically non-conductive nanoparticles.

13. The method of claim 12, wherein heating the first nanoparticle ink film includes using an infrared light emitting diode (IRLED).

14. The method of claim 11, wherein the first electrically non-conductive nanoparticles include a material selected from the group consisting of aluminum oxide, diamond, hexagonal boron nitride, cubic boron nitride, and aluminum nitride.

15. The method of claim 11, wherein the additive process includes a process selected from the group consisting of a discrete droplet dispensing process, a continuous extrusion process, a direct laser transfer process, an electrostatic deposition process, and an electrochemical deposition process.

16. The method of claim 11, wherein inducing cohesion of the first electrically non-conductive nanoparticles includes a process selected from the group consisting of a scanned laser heating process, a flash heating process and a spike heating process.

* * * * *